(12) United States Patent
Kambe et al.

(10) Patent No.: US 11,343,911 B1
(45) Date of Patent: May 24, 2022

(54) FORMABLE TRANSPARENT CONDUCTIVE FILMS WITH METAL NANOWIRES

(71) Applicant: C3Nano Inc., Hayward, CA (US)

(72) Inventors: Yu Kambe, Chicago, IL (US); Yung-Yu Huang, Palo Alto, CA (US); Christopher S. Scully, Campbell, CA (US); Xiqiang Yang, Hayward, CA (US); Ajay Virkar, San Francisco, CA (US)

(73) Assignee: C3 Nano, Inc., Hayward, CA (US)

( * ) Notice: Subject to any disclaimer, the term of this patent is extended or adjusted under 35 U.S.C. 154(b) by 1100 days.

(21) Appl. No.: 14/680,390

(22) Filed: Apr. 7, 2015

Related U.S. Application Data

(60) Provisional application No. 61/978,607, filed on Apr. 11, 2014.

(51) Int. Cl.
*H05K 1/02* (2006.01)
*H05K 3/20* (2006.01)
(Continued)

(52) U.S. Cl.
CPC ............ *H05K 1/0296* (2013.01); *F21V 21/00* (2013.01); *H05K 1/0274* (2013.01); *H05K 1/032* (2013.01);
(Continued)

(58) Field of Classification Search
None
See application file for complete search history.

(56) References Cited

U.S. PATENT DOCUMENTS

| 6,741,019 B1 | 5/2004 | Filas et al. |
| 7,218,004 B2 | 5/2007 | Pan et al. |

(Continued)

FOREIGN PATENT DOCUMENTS

| CN | 103380466 A | 10/2013 |
| JP | 2009-129882 A | 6/2009 |

(Continued)

OTHER PUBLICATIONS

Fuse, Definition of Fuse in English. Oxford Dictionaries https://en.oxforddictionaries.com/definition/fuse. Relieved Mar. 13, 2017.

(Continued)

*Primary Examiner* — Ramsey Zacharia
(74) *Attorney, Agent, or Firm* — Christensen Fonder Dardi; Elizabeth A. Gallo; Peter S. Dardi

(57) ABSTRACT

A formable transparent conductive film are described that comprise a sparse metal conductive layer, a thermoplastic polymer substrate supporting the sparse metal conductive layer, a viscoelastic polymer with a thickness from about 15 microns to about 150 microns over the sparse metal conductive layer. A layered film structure can be formed that is suitable for contouring on the surface of a three dimensional object without unacceptable increases in sheet resistance and with good optical transparency and low haze. The formable films can be placed into a frozen configuration bent 90 degrees with a radius of curvature of no more than about 5 centimeters while exhibiting a surface resistance of no more than about 500 ohms/sq. with a total transmittance with respect to visible light of at least about 80%.

15 Claims, 9 Drawing Sheets

(51) Int. Cl.
*H05K 1/03* (2006.01)
*F21V 21/00* (2006.01)
*F21Y 101/02* (2006.01)

(52) U.S. Cl.
CPC .......... *H05K 3/20* (2013.01); *F21Y 2101/02* (2013.01); *H05K 2201/0108* (2013.01); *H05K 2201/0129* (2013.01); *H05K 2201/0133* (2013.01); *H05K 2201/0191* (2013.01)

(56) References Cited

U.S. PATENT DOCUMENTS

| | | |
|---|---|---|
| 7,849,424 B2 | 12/2010 | Wolk et al. |
| 7,902,639 B2 | 3/2011 | Garrou et al. |
| 7,922,787 B2 | 4/2011 | Wang et al. |
| 8,018,563 B2 | 9/2011 | Jones et al. |
| 8,018,568 B2 | 9/2011 | Allemand et al. |
| 8,031,180 B2 | 10/2011 | Miyamoto et al. |
| 8,049,333 B2 | 11/2011 | Alden et al. |
| 8,052,773 B2 | 11/2011 | Takada |
| 8,094,247 B2 | 1/2012 | Allemand et al. |
| 8,174,667 B2 | 5/2012 | Allemand et al. |
| 8,198,796 B2 | 6/2012 | Takada |
| 8,456,074 B2 | 6/2013 | Armitage et al. |
| 8,663,811 B2 | 3/2014 | Everaerts et al. |
| 9,150,746 B1 | 10/2015 | Li et al. |
| 9,183,968 B1 | 11/2015 | Li et al. |
| 9,396,843 B2 | 7/2016 | Chung et al. |
| 10,026,518 B2 | 6/2018 | Sepa et al. |
| 10,020,807 B2 | 7/2018 | Virkar et al. |
| 10,100,213 B2 | 10/2018 | Li et al. |
| 2005/0074589 A1 | 4/2005 | Pan et al. |
| 2005/0196707 A1 | 9/2005 | Cok |
| 2005/0214480 A1 | 9/2005 | Garbar et al. |
| 2005/0215689 A1 | 9/2005 | Garbar et al. |
| 2006/0052947 A1 | 3/2006 | Hu |
| 2006/0083694 A1 | 4/2006 | Kodas et al. |
| 2006/0163744 A1 | 7/2006 | Vanheusden et al. |
| 2006/0205240 A1 | 9/2006 | Pan et al. |
| 2006/0286785 A1* | 12/2006 | Rogers ............... B82Y 10/00 438/584 |
| 2007/0074316 A1 | 3/2007 | Alden et al. |
| 2008/0003130 A1 | 1/2008 | Xia et al. |
| 2008/0034921 A1 | 2/2008 | Vanheusden et al. |
| 2008/0050513 A1 | 2/2008 | Wang et al. |
| 2008/0143906 A1 | 6/2008 | Allemand et al. |
| 2008/0147019 A1 | 6/2008 | Song et al. |
| 2008/0210052 A1 | 9/2008 | Allemand |
| 2008/0213663 A1 | 9/2008 | Hu et al. |
| 2008/0259262 A1 | 10/2008 | Jones et al. |
| 2008/0283799 A1 | 11/2008 | Alden et al. |
| 2008/0286447 A1 | 11/2008 | Alden et al. |
| 2008/0286488 A1 | 11/2008 | Li et al. |
| 2008/0292979 A1 | 11/2008 | Ding et al. |
| 2008/0317982 A1 | 12/2008 | Hecht et al. |
| 2009/0011147 A1 | 1/2009 | Dictus |
| 2009/0223703 A1 | 1/2009 | Winoto |
| 2009/0052029 A1 | 2/2009 | Dai et al. |
| 2009/0088326 A1 | 4/2009 | Baecker |
| 2009/0098405 A1 | 4/2009 | Matsunami |
| 2009/0129004 A1 | 5/2009 | Gruner |
| 2009/0130433 A1 | 5/2009 | Takada |
| 2009/0166055 A1 | 7/2009 | Guiheen et al. |
| 2009/0196788 A1 | 8/2009 | Wang et al. |
| 2009/0242231 A1 | 10/2009 | Miyagisima et al. |
| 2009/0283304 A1 | 11/2009 | Winoto |
| 2009/0301769 A1 | 12/2009 | Seppa et al. |
| 2009/0305437 A1 | 12/2009 | Allemand et al. |
| 2009/0311530 A1 | 12/2009 | Hirai et al. |
| 2009/0317435 A1 | 12/2009 | Vandesteeg et al. |
| 2009/0321113 A1 | 12/2009 | Allemand et al. |
| 2009/0321364 A1 | 12/2009 | Spaid et al. |
| 2010/0078197 A1 | 4/2010 | Miyagishima et al. |
| 2010/0078602 A1 | 4/2010 | Hosoya et al. |
| 2010/0140564 A1 | 6/2010 | Overbeek et al. |
| 2010/0197068 A1 | 8/2010 | Poon et al. |
| 2010/0243295 A1 | 9/2010 | Allemand et al. |
| 2010/0307792 A1 | 12/2010 | Allemand et al. |
| 2011/0024159 A1 | 2/2011 | Allemand et al. |
| 2011/0042126 A1 | 2/2011 | Spaid et al. |
| 2011/0045272 A1 | 2/2011 | Allemand |
| 2011/0048170 A1 | 3/2011 | Bhatia et al. |
| 2011/0062389 A1 | 3/2011 | Wang et al. |
| 2011/0088770 A1 | 4/2011 | Allemand et al. |
| 2011/0094651 A1 | 4/2011 | Kuriki |
| 2011/0095275 A1 | 4/2011 | Li et al. |
| 2011/0151211 A1 | 6/2011 | Chang et al. |
| 2011/0162870 A1 | 7/2011 | Markovich et al. |
| 2011/0163403 A1 | 7/2011 | Bhatia et al. |
| 2011/0174190 A1 | 7/2011 | Sepa et al. |
| 2011/0192633 A1 | 8/2011 | Allemand |
| 2011/0253668 A1 | 10/2011 | Winoto et al. |
| 2011/0281070 A1 | 11/2011 | Mittal et al. |
| 2011/0285019 A1 | 11/2011 | Alden et al. |
| 2011/0297642 A1 | 12/2011 | Allemand et al. |
| 2012/0033367 A1 | 2/2012 | Jones et al. |
| 2012/0034129 A1 | 2/2012 | Suh et al. |
| 2012/0073947 A1 | 3/2012 | Sakata et al. |
| 2012/0097059 A1 | 4/2012 | Allemand et al. |
| 2012/0103660 A1 | 5/2012 | Gupta et al. |
| 2012/0104374 A1 | 5/2012 | Allemand |
| 2012/0107598 A1 | 5/2012 | Zou et al. |
| 2012/0127097 A1 | 5/2012 | Gaynor et al. |
| 2012/0127113 A1 | 5/2012 | Yau et al. |
| 2012/0132930 A1 | 5/2012 | Young et al. |
| 2012/0138913 A1 | 6/2012 | Alsayed et al. |
| 2012/0152135 A1 | 6/2012 | Stebbins et al. |
| 2012/0168684 A1 | 7/2012 | Magdassi et al. |
| 2012/0223358 A1 | 9/2012 | Pschenitzka |
| 2012/0249453 A1 | 10/2012 | Tsukamoto |
| 2013/0000952 A1 | 1/2013 | Srinvas et al. |
| 2013/0001478 A1 | 1/2013 | Allemand et al. |
| 2013/0056244 A1 | 3/2013 | Srinivas et al. |
| 2013/0120846 A1 | 5/2013 | Dai et al. |
| 2013/0146335 A1 | 6/2013 | Gambino et al. |
| 2013/0153829 A1 | 6/2013 | Kondo et al. |
| 2013/0168138 A1 | 7/2013 | Yamazaki et al. |
| 2013/0189502 A1 | 7/2013 | Takahashi et al. |
| 2013/0266795 A1 | 10/2013 | Schultz et al. |
| 2013/0291683 A1 | 11/2013 | Sepa et al. |
| 2013/0341074 A1 | 12/2013 | Virkar et al. |
| 2013/0342221 A1 | 12/2013 | Virkar et al. |
| 2014/0004371 A1 | 1/2014 | Chung et al. |
| 2014/0017483 A1 | 1/2014 | Whitcomb |
| 2014/0054515 A1 | 2/2014 | Lowenthal et al. |
| 2014/0099486 A1 | 4/2014 | Ollmann et al. |
| 2014/0238833 A1 | 8/2014 | Virkar et al. |
| 2014/0251662 A1* | 9/2014 | Rotto et al. ............... C09J 9/02 174/253 |
| 2014/0255707 A1 | 9/2014 | Philip, Jr. et al. |
| 2014/0262454 A1 | 9/2014 | Zou et al. |
| 2014/0374146 A1 | 12/2014 | Saito et al. |
| 2015/0144380 A1 | 5/2015 | Yang et al. |
| 2015/0206623 A1 | 7/2015 | Poon |
| 2015/0208498 A1 | 7/2015 | Poon |
| 2015/0321257 A1 | 11/2015 | Suh et al. |
| 2016/0096967 A1 | 4/2016 | Virkar et al. |
| 2016/0108256 A1 | 4/2016 | Yang et al. |
| 2016/0122562 A1 | 5/2016 | Yang et al. |
| 2017/0015857 A1 | 1/2017 | Kodama et al. |

FOREIGN PATENT DOCUMENTS

| | | |
|---|---|---|
| JP | 5289859 B2 | 2/2010 |
| JP | 2011-119142 A | 6/2011 |
| JP | 2011-210454 A | 10/2011 |
| JP | 2012009383 A | 1/2012 |
| JP | 2012022844 A | 2/2012 |
| JP | 2012216535 A | 11/2012 |
| JP | 2013-084628 A | 5/2013 |
| KR | 10-2007-0029151 | 3/2007 |
| KR | 2013-0027634 A | 3/2013 |
| KR | 2013-0102723 A | 9/2013 |
| TW | 2012-36967 A1 | 9/2012 |

(56) References Cited

FOREIGN PATENT DOCUMENTS

| | | | |
|---|---|---|---|
| WO | 2006-072959 A1 | 7/2006 | |
| WO | 2008/046058 A2 | 4/2008 | |
| WO | 2009035059 A1 | 3/2009 | |
| WO | 2009/086161 | 7/2009 | |
| WO | 2009/156990 | 12/2009 | |
| WO | 2010/036113 | 4/2010 | |
| WO | 2010-109465 A1 | 9/2010 | |
| WO | 2010-129604 A1 | 11/2010 | |
| WO | 2011-008227 A1 | 1/2011 | |
| WO | 2011-097470 A2 | 8/2011 | |
| WO | 2011-106730 A2 | 9/2011 | |
| WO | 2012-168941 A1 | 12/2012 | |
| WO | 2013/006349 A1 | 1/2013 | |
| WO | WO-2013025330 A2 * | 2/2013 | ............... C09J 9/02 |
| WO | 2013/040245 A2 | 3/2013 | |
| WO | 2013-056242 A1 | 4/2013 | |
| WO | 2013-094926 A1 | 6/2013 | |
| WO | 2013-095971 A1 | 6/2013 | |
| WO | 2013-133272 A1 | 9/2013 | |
| WO | 2013-133285 A1 | 9/2013 | |
| WO | 2014-127909 A1 | 8/2014 | |
| WO | 2015-077145 A2 | 5/2015 | |

OTHER PUBLICATIONS

Tokuno et al., "Fabrication of Silver Nanowire Transparent Electrodes at Room Tempature," Nano Research, (2011), 4(12): 1215-1222.
Zhu et al., "Transferable Sefl-welding Silver Nanowire Network as High Performance Transparent Flexible Electrode," Nanotechnology 24, (Jul. 26, 2013), 24(335202): 1-7.
Bi et al., "In situ Oxidation synthesis of Ag/AgCl core-shell nanowires and their photocatalytic properties," Chem. Commun. (2009), pp. 6551-6553.
De et al., "Silver Nanowire Networks as Flexible, Transparent Conducting Films: Extremely High DC to Optical Conductivity Ratio," ACS Nano, 3(7):1767-1774 (Jun. 2009).
Grouchko et al., "Conductive Inks with 'built-in' mechanism that enables sintering at room temperature," ACS Nano, 5(4):3354-3359 (2011).
Hu et al., "Scalable coating properties of flexible, silver nanowire electrodes," ACS Nano, 4(5):2955-2963 (2010).
Lam et al., "Self-diffusion in silver at low temperatures," Phys. Stat. Sol. (b), 57 (1973), p. 225-236.
Liu et al., "Silver Nanowire-Based Transparent, Flexible and Conductive Thin Film," Nanoscale Research Letters, vol. 6(75), Jan. 2011, 8 pages.
Luo et al., "Size effect on thermodynamic properties of silver nanoparticles," J. Phys. Chem. C, 112 (2008), pp. 2359-2369.
Magdassi et al., "Triggering the Sintering of Silver Nanoparticles at Room Temperature," ACS Nano, 4(4):1943-1948 (2010).
Nanda, et al., "Higher surface free energy of free nanoparticles," Phys. Rev. Letters, 91(10):106102-1 (2003).
Pothoven, "Laser Patterning of Silver Nanowires," Information Display Magazine, Sep. 2012, 28(9), (10 pages).
Raaen, "Diffusion in silver fluoride," Physical Review B, 21(10):4895-4897 (1980).
Redmond et al., "Electrochemical Ostwald ripening of colloidal Ag particles on conductive substrates," Nano Letters, 5(1):131-135 (2005).
Safaei et al., "Modeling the Melting Temperature of Nanoparticles by an Analytical Approach," J. Phys. Chem. C, 112 (2008), pp. 99-105.
Sun et al., "AgCl nanoparticle nanowires fabricated by template method," Materials Letters, 61 (2007), pp. 1645-1648.
Van Heyningen, R., "Electron Drift Mobility in Silver Chloride," Physical Review, (Dec. 1, 1962), pp. 2112-2118.
Yan et al., "Recent Research Progress on Preparation of Silver Nanowires by Soft Solution Method," Rev. Adv. Mater. Sci. 24, (2010), pp. 10-15.

Garnett et al., "Self-limited Plasmonic Welding of Silver Nanowire Junctions," Nature Materials, vol. 11, p. 241-249, Mar. 2012.
Spechler et al., "Direct Write Pulsed Laser Processed Silver Nanowire Networks for Transparent Conducting Electrodes," Springer-Verlag, vol. 108, pp. 25-28, May 10, 2012.
Chang et al., "Highly foldable transparent conductive films composed of silver nanowire junctions prepared by chemical metal reduction," Nanotechnology 25 (2014) 285601 (7 pages).
Allen, "Photoinitiators for UV and visible curing of coatings: mechanisms and properties", Journal of Photochemistry and Photobiology A Chemistry, vol. 100, (1996) p. 101-107.
BERMOCOLL® E 230 FQ Product Information, Akzo Nobel Chemicals AG, Performance Additives, www.akzonobel.com/pa.
Cambrios Archived Website, ClearOhm, "High Performance Transparent Conductive Material", Cambrios technologies Corporation, Nov. 2010.
Chen et al., "Polysaccharide Hydrogenls for Protein Drug Delivery", Carbohydrate Polymers, 28, (1995), p. 69-76.
Coskun et al., "Optimization of silver nanowire networks for polymer light emitting diode electrodes", Nanotechnology, 24, 125202, (2013) p. 1-9.
Ducamp-Sanguesa et al. "Synthesis and Characterization of Fine and Monodisperse Silver Particles of Uniform Shape", Journal of Solid State Chemistry, vol. 100 pp. 272-280 (1992).
Guo, Shouwu, "The Creation of Nanojunctions", The Royal Society of Chemistry, Nanoscale, (2010), 2, pp. 2521-2529.
Hu et al., "Metal nanogrids, nanowires, and nanofibers for transparent electrodes", MRS Bulletin, vol. 36, p. 1-7, Oct. 2011.
Imam et al., "Biobased adhesives, gums, emulsions, and binders: current trends and future prospects", Journal of Adhesion Science and Technology, vol. 27, Nos. 18-19, 1972-1997, (2013).
Kang et al., "Halide Welding for Silver Nanowire Network Electrode," ACS Applied Materials & Interfaces 2017, 9, 30779-30785, Apr. 18, 2017.
Kang et al., "Epitaxial-Growth-lnduced Junction Welding of Silver Nanowire Network Electrodes" CS Nano 2018, 12, 4894-4902, Apr. 2018.
Khanarian et al., "The Optical and Electrical Properties of Silver Nanowire Mesh Films", Journal of Applied Physics, 114(024302), doi: 10.1063/1.4812390, (2013).
Kim et al., "Large Discrete Resistance Jump at Grain Boundary in Copper Nanowire", American Chemical Society Nano Letters 2010, 10, 3096-3100, Jul. 7, 2010.
Kumar et al., "Silver nanowire based flexible electrodes with improved properties: High conductivity, transparency, adhesion and low haze", Material Research Bulletin, vol. 48, (2013), p. 2944-2949.
Kunjappu, "Ink Chemistry", www.chemistryworld.com/news/ink-chemistry/3002158.article, p. 1-18, Feb. 20, 2019.
Lu et al., "Cold Welding of Ultrathin Gold Nanowires", Nature Nanotechnology, vol. 5, p. 1-7, Mar. 2010.
Ma et al., "Synthesis of small silver nanocubes in a hydrophobic solvent by introducing oxidative etching with Fe(lll) species†". Journal of Materials Chemistry 2010, 20, 3586-3589, Apr. 9, 2010.
Madaria et al., "Uniform, Highly Conductive, and Patterned Transparent Films of a Percolating Silver Nanowire Network on Rigid and Flexible Substrates Using a Dry Transfer Technique", NanoRes, (2010) 3: 564-573.
Martin et al., "Hydrophilic Matrix Tablets for Oral Controlled Release", AAPS Advances in the Pharmaceutical Sciences Series 16, DOI 10.1007/978-1-4939-1519-4_5. (2014).
Poole, C.F., "Pyrolysis Gas Chromatography", Gas Chromatography, Chapter 11, Elservier Inc., (2012).
Sun et al., "Crystalline Silver Nanowires by Soft Solution Processing", ACS Nano Letters 2002, vol. 2 No. 2, 165-168, Jan. 3, 2002.
Wang et al., "Water-Soluble Ethylhydroxyethyl Cellulose Prevents Bacterial Translocation Induced by Major Liver Resection in the Rat", Annals of Surgery, vol. 217 No. 2, p. 155-167, (1993).
Wiley et al., "Polyol Synthesis of Silver Nanostructures: Control of Product Morphology with Fe(ll) or Fe(lll) Species", ACS Journal of Surfaces and Colloids, vol. 21 No. 18, 8077-8080, Aug. 30, 2005.

* cited by examiner

FORMABLE TRANSPARENT CONDUCTIVE FILMS WITH METAL NANOWIRES

CROSS REFERENCE TO RELATED APPLICATIONS

This application claims priority to U.S. provisional patent application No. 61/978,607 to Kambe et al., entitled "Formable Transparent Conductive Films with Metal Nanowires," incorporated herein by reference.

FIELD OF THE INVENTION

The invention relates to transparent electrically conductive films, especially films formed using metal nanowires. The invention further relates to processing to form the films and processing to form devices from the films.

BACKGROUND OF THE INVENTION

Functional films can provide important utility in a range of contexts. For example, electrically conductive films can be important for the dissipation of static electricity when static can be undesirable or dangerous. Optical films can be used to provide various functions, such as polarization, anti-reflection, phase shifting, brightness enhancement or other functions. High quality displays can comprise one or more optical coatings.

Transparent conductors can be used for several optoelectronic applications including, for example, touch-screens, liquid crystal displays (LCD), flat panel display, organic light emitting diode (OLED), solar cells and smart windows. Historically, indium tin oxide (ITO) has been the material of choice due to its relatively high transparency at high conductivities. There are however several shortcomings with ITO. For example, ITO is a brittle ceramic which needs to be deposited using sputtering, a fabrication process that involves high temperatures and vacuum and therefore is relatively slow and expensive. Additionally, ITO is known to crack easily on flexible substrates.

SUMMARY OF THE INVENTION

In a first aspect, the invention pertains to a formable transparent conductive film comprising a sparse metal conductive layer, a thermoplastic polymer substrate supporting the sparse metal conductive layer, a viscoelastic polymer with a thickness from about 15 microns to about 150 microns over the sparse metal conductive layer. In some embodiments, the film has a total transmittance for visible light of at least about 80%.

In another aspect, the invention pertains to a formable transparent conductive film comprising a layer of sparse metal conductive layer, a thermoplastic polymer substrate supporting the sparse metal conductive layer, a viscoelastic polymer over the sparse metal conductive layer. The film when formed into a frozen configuration bent 90 degrees with a radius of curvature of no more than about 5 centimeters can exhibit a surface resistance of no more than about 500 ohms/sq. with a total transmittance with respect to visible light of at least about 80%.

In a further aspect, the invention pertains to a display device comprising a three dimensional surface, light emitting elements positioned to emit light from the surface and a transparent electrically conductive film covering at least a portion of the light emitting elements wherein the transparent electrically conductive film comprises a thermoplastic polymer substrate that is formed to span an edge of the surface to cover at least portions of two angled surfaces with an angle relating the surfaces of at least about 60 degrees such that the film has a portion with a radius of curvature of no more than about 5 centimeters. In some embodiments, the film can exhibit a surface resistance of no more than about 500 ohms/sq. with a total transmittance with respect to visible light of at least about 80%.

In additional aspects, the invention pertains to a method for forming a device with a display and a formed transparent conductive film, the method comprising securing a transparent conductive film around an edge of the device with the film extending around the edge in contact with at least portions of two surfaces an angle relating the surfaces of at least about 60 degrees to form a film having a surface resistance of no more than about 500 ohms/sq. with a total transmittance with respect to visible light of at least about 80%.

DETAILED DESCRIPTION

Figure 1:
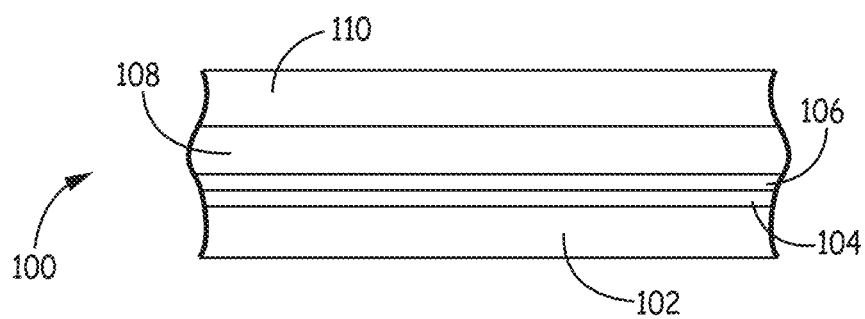
FIG. 1 is a schematic fragmentary side view of a layer stack of an optically clear conductive film.

Sparse metal conductive structures, such as metal nanostructured networks, can be combined into a particular layered structure to form a thin film with good electrical conductivity and good optical properties when formed over a three dimensional structure that imposes significant mechanical deformation of the film. Sparse refers to the significant gaps in the metal coverage in the layer such that the sparse metal conductive layers can be transparent to visible light. Thus, a transparent sparse metal conductive layer generally can be formed, for example using metal nanowires, on a transparent flexible substrate for further processing into a transparent conductive film. The sparse metal conductive structure can be further stabilized with a viscoelastic polymer layer, such as an optically clear adhesive, and optionally a plastic, i.e., non-elastic, overcoat to form a surprisingly stable structure that can tolerate stretching and bending associated with formation around a three dimensional structure, such as the three dimensional outer surface of an electronic device. Thus, a layered film structure can be formed that is suitable for contouring on the surface of a three dimensional object without unacceptable increases in sheet resistance and with good optical transparency and low haze. Formation of the film onto a three dimensional surface generally involves heating the film above the glass transition temperature of a thermoplastic layer, shaping the shaping the film when hot and allowing the film to cool fixing the film into the selected shape. The films can be formed using suitable commercial processing techniques and can be used to make produces using reasonable processing techniques.

As noted above, sparse metal conductive layers can be effectively formed from metal nanowires. To decrease junction resistance between adjacent metal nanowires, pressure has been used to flatten the nanowires against each other to form transparent conductive films, as described for example in U.S. Pat. No. 8,049,333 to Alden et al., entitled "Transparent Conductors Comprising Metal Nanowires," incorporated herein by reference. In embodiments of particular interest, a metal nanostructured network can be formed from fused metal nanowires with desirable results with respect to forming transparent conductive films. Specifically, the metal nanostructured networks can be formed as fused metal nanowires using fusing techniques that have been developed to form transparent conductors with excellent electrical and optical qualities, which can be patterned conveniently and can be combined with a polymer binder to form an initially stabilized electrically conductive film. The metal nanostructured networks formed from fused metal nanowires provide desirable alternative to other nanowire based transparent conductive film structures.

Transparent conductive films are significant with respect to the formation of a range of electrical devices, such as touch screens. Electrically conductive nanoscale structures are promising for the formation of transparent conductive films due to low optical absorption. However, electrical resistance associated with percolation of charge carriers between adjacent nanoscale elements can increase the electrical resistance of corresponding films. Also, stresses applied to the films can accentuate the electrical resistance associated with charge carrier percolation. It has been found that forming transparent electrically conductive films with appropriately selected layers provides a robust structure with a low sheet resistance and good optical properties, especially when nanostructured metal networks are used to provide the electrical conductivity. It has been surprisingly found that a combination of appropriate polymer coatings with sparse metal conductive layers can provide a combination of stability and sufficient flexibility to allow for formation over 3-dimensional structures. A thermoplastic layer provides for shaping of the film as well as significant protection from mechanical and environmental assaults. In combination with a viscoelastic layer, the viscoelastic layer has been found to stabilize the transparent conductive layer to provide for formation of the film without undesirable loss of electrically conductive properties of the metal nanostructured network. In particular, optically conductive adhesives as the viscoelastic layer, have been found to be particularly effect. While not wanting to be limited by theory, the viscoelastic properties of the adhesive may contribute to stabilizing the nanostructured layer through the moderation of the distortion of the metal nanostructure to allow for shape changes without breaking conductive pathways.

Transparent, electrically conductive films find important applications, for example in solar cells and touch screens. Transparent conductive films formed from metal nanowire components offer the promise of lower cost processing and more adaptable physical properties relative to traditional materials. As described herein, transparent conductive films with sparse metal conductive layers can be formed, i.e. molded onto a three dimensional structure, without excessively large loss of desirable properties, in particular electrical conductivity. The formation process applies significant stresses on the material, which can degrade performance. Electrical conductivity based on nanomaterials, such as metal nanowires, generally involves a layer of nano-elements with contributions to electrical resistance often coming to a significant degree from connections between elements of the structure. As described herein fusing of metal nanowires has been discovered to be an effective way to form stable highly conductive films with metal nanostructured networks. In a multilayered film with a viscoelastic polymer layer, the resulting film structure has been found to be robust with respect to the formation process while maintaining desirable electrical conductivity.

Formation generally refers to a practical processing practice of conforming the film, in this case a transparent conductive film, around curved contours of a device, such as a portable electronic device, for example to form touch sensors or the like. To provide for significant contouring and to freeze the contoured film in the selected shape, the film is generally heated above the glass transition temperature of a thermoplastic layer, followed by contouring the heated film and cooling the film or allowing the film to cool thus preserving the contoured shape. In the practical context, the particular physical parameters associated with the formation process can vary according to the device parameters. However, to provide a specific reference in the context of evaluation of the film, we can specify a particular reference formation process to judge processability of the film material. In particular, the performance of the film can be judged when conforming the film to a three dimensional surface with a corner connecting two surfaces at 90 degrees with a specified maximum radius of curvature, e.g., 5 centimeters. Similarly, other bending and stretching testing processes are described further below. The polymer films described in the examples below exhibit low sheet resistances under significantly more strenuous formation testing as well as under strenuous bending and stretching conditions. Thus, the present films represent a significant structure for forming realistic formed products.

Metal nanowires can be formed from a range of metals, and metal nanowires are available commercially. While metal nanowires are inherently electrically conducting, the vast majority of resistance in the metal nanowires based films is believed to due to the junctions between nanowires. Depending on processing conditions and nanowire properties, the sheet resistance of a relatively transparent nanowire film, as deposited, can be very large, such as in the giga-ohms/sq. range or even higher. Various approaches have been proposed to reduce the electrical resistance of the nanowire films without destroying the optical transparency. Low temperature chemical fusing to form a metal nano-structured network has been found to be very effective at lowering the electrical resistance while maintaining the optical transparency.

In particular, a significant advance with respect to achieving electrically conductive films based on metal nanowires has been the discovery of well controllable processes to form a fused metal network where adjacent sections of the metal nanowires fuse. In particular, it was discovered in previous work that halide ions can drive the fusing of metal nanowires to form fused metal nanostructures. Fusing agents comprising halide anions were introduced in various ways to successfully achieve the fusing with a corresponding dramatic drop in the electrical resistance. Specifically, the fusing of metal nanowires with halide anions has been accomplished with vapors and/or solutions of acid halides as well as with solutions of halide salts. Fusing of metal nanowires with halide sources is described further in published U.S. patent applications 2013/0341074 to Virkar et al., entitled "Metal Nanowire Networks and Transparent Conductive Material," and 2013/0342221 to Virkar et al. (the '221 application), entitled "Metal Nanostructured Networks and Transparent Conductive Material," both of which are incorporated herein by reference. The '221 application describes effective patterning based on the selective delivery of HCl vapors for forming high electrical conductivity contrast patterns that are effectively invisible to an ordinary observer under room lighting.

Metal halides formed along the surface of metal nanowires are believed to increase the mobility/diffusivity of the metal ions that result in fusing of points of contact or near contact between nanowires to form the fused network. Evidence suggests that a metal halide shell forms on the resulting fused nanowire network when the halide fusing agents are used. While not wanting to be limited by theory, it is believed that the metal halide coating on the metal nanowires results in mobilization of metal atoms/ions from the nanowires such that the mobilized ions condense to form joints between nearby nanowires forming the nanostructured network and presumably lowering the free energy when forming the fused network with a net movement of metal atoms within the nanostructure.

An extension of the process for forming fused metal nanowire networks was based on reduction/oxidation (redox) reactions that can be provided to result in fused nanowires without destroying the optical properties of the resulting film. Without wanting to be limited by theory, again the driving force would seem to be a lowering of free energy through the migration of metal to junctions to form a fused nanostructured network. Metal for deposition at the junctions can be effectively added as a dissolved metal salt or can be dissolved from the metal nanowires themselves. The effective use of redox chemistry for fusing metal nanowires into a nanostructured network is described further in published U.S. patent application 2014/0238833A1 to Virkar et al. (the '833 application), entitled "Fused Metal Nanostructured Networks, Fusing Solutions With Reducing Agents and Methods for Forming Metal Networks," incorporated herein by reference. The '833 application also described a single solution approach for the formation of fused metal nanostructured networks, and successful use of single solution deposition for forming metal nanostructured networks for formable films is described in the Examples below.

A further approach for the fusing of the nanowires has been described based on providing a high pH, i.e., alkaline, fusing solution to a metal nanowire film. See, copending U.S. patent application Ser. No. 14/087,669 to Yang et al. (the '069 application), entitled "Transparent Conductive Coatings Based on Metal Nanowires, Solution Processing Thereof, and Patterning Approaches," incorporated herein by reference. Generally, to achieve effective fusing, the pH can be greater than about 9.5 pH units. It is believed that the alkaline conditions effectively mobilize metal ions along the surface of the metal nanowires. The metal then selectively migrates to points of contact or near contact between adjacent metal nanowires to fuse the wires. Thus, the alkaline fusing provides another alternative to the halide based fusing or the redox based fusing.

For some applications, it is desirable to pattern the electrically conductive portions of the film to introduce desired functionality, such as distinct regions of a touch sensor. Of course, patterning can be performed simply by changing the metal loading on the substrate surface either by printing metal nanowires at selected locations with other locations being effectively barren of metal or to etch or otherwise ablate metal from selected locations either before and/or after fusing the nanowires. However, it has been discovered that high contrast in electrical conductivity can be achieved between fused and unfused portions of a layer with essentially equivalent metal loading so that patterning can be performed by selectively fusing the metal nanowires. This ability to pattern based on fusing provides significant additional patterning options based on selective fusing of the nanowires, for example, through the selective delivery of a fusing solution or vapor. Patterning based on selective fusing of metal nanowires is described in the '833 application and the '069 application above.

The total film structure for formable films can generally have a thickness from 50 microns to about a millimeter. This thickness is divided between a substrate, i.e., the structure below the metal nanostructured layer, the metal nanostructured network, and over-layers above the metal nanostructured layer. With respect to reference to the layer order of a particular layered stack, the resulting structure can be flipped over with respect to description of the structure as well as further processing into a product, so reference to the substrate and over-layers is arbitrary and can be reversed. The substrate generally has a thickness from about 20 microns to about 500 microns, and the over-layers can have a total thickness from about 15 microns to about 500 microns. The substrate and over-layers can each independently have one polymer layer or a plurality of polymer layers. In some embodiments, the over-layers can comprise a viscoelastic layer and a non-elastomer layer. The metal nanostructured conductive layer may or may not further comprise a polymer binder. Unless otherwise indicated, references to thicknesses refer to average thicknesses over the referenced layer or film, and adjacent layers may intertwine at their boundaries depending on the particular materials. The total film structure can have a total transmission of visible light of at least about 85%, a haze of no more than about 2 percent and a sheet resistance after formation of no more than about 250 ohms/sq.

Viscoelastic polymers have properties that are partially elastomeric in character and partially like a viscous material. Pressure sensitive adhesives can be viscoelastic material, and the viscous creep exhibited by these materials can contribute to adhesive wetting and the adhesive function. On the other hand, the elastic nature of these materials provides structural integrity and stability. Optically transparent adhesives are available both as tapes and as coatable formulations to provide desired transparent viscoelastic layers. Particularly desirable results are presented in the Examples based on optically clear adhesive tapes.

The formable films generally comprise at least one layer of non-elastomeric polymer, which generally is thermoplastic. During the formation process, the thermoplastic is heated briefly above its glass transition temperature so that the material can be deformed along the three dimensional object as part of the formation process. The film then rapidly cools and the thermoplastic is below its glass transition temperature to form a harder material. These thermoplastic, non-elastomeric layers can provide strength and protection to the structure.

In some embodiments, a formable film generally can have a non-elastomer layer above and below the layer of metal nanostructured layer and a viscoelastic polymer layer. The combination of layers is surprisingly effective at stabilizing the conductivity of the metal conductive structure when forming the film along the curved three dimensional surface of a device. While not wanting to be limited by theory, the viscoelastic polymer seemingly stabilizes the deformation of the metal nanostructure without breaking the electrically conducting links between the metal segments. A non-elastic polymer adjacent the metal nanostructured network evidently does not provide similar stabilization. Thus, the structures described herein provide a significant processing advance with respect to transparent conductive films with high conductivity and good optical properties.

For the production of a formable film as described herein a metal nanostructured conductive layer can be formed on a transparent polymer substrate. In embodiments of particular interest, the metal nanostructured conductive layer can be a nanostructured metal networked formed from fused metal nanowires, which have been found to be particularly effective structures. The layer formed with the metal nanowires or the like may or may not comprise a polymer binder, which generally can be deposited with the metal nanowires. Similarly, the metal nanostructured network may or may not be patterned, as summarized above. Optionally, a curable polymer overcoat, e.g., of a non-elastomeric thermoplastic polymer, can be applied to the metal nanostructured layer. A viscoelastic polymer layer generally is applied adjacent the metal nanostructured network. For example, an optically clear adhesive tape can be laminated to the structure. A further stabilizing overcoat can be applied, for example by lamination, over the viscoelastic polymer layer. Suitable stabilizing overcoats can be similar sheets of polymer as used for the substrate. Additional layers can be added as desired. For example, the viscoelastic layer can be an optically clear adhesive tape with an embedded carrier layer of a non-elastomeric polymer. Using convenient processing approaches, the completed film can have good electrical conductivity as determined by sheet resistance measurements and good optical properties with respect to high transmission of visible light and low haze. In addition to the recitation of the layers optionally be reversed in structure, the processing steps can in principle be reversed to build a particular structure from the opposite side up.

Transparent conductive films are finding extensive use for touch screens and the like, for example, capacitive switches, electrodes for organic light emitting diodes (OLED) and light emitting diodes (LED), solar cells, smart windows and as replacements for conventional mechanical buttons. Touch screens are finding their way into a growing array of products. The ability to have a formable transparent conductive film extends the possible uses for the film and can provide practical additional functionality to three dimensional electronic devices. The films described herein provide practical solutions with realistic film systems and excellent performance under strenuous testing conditions.

Formable Film Structure

As noted above, the basic structure of the formable transparent conductive film has a sparse metal conductive structure, such as a metal nanostructured network, embedded within polymer layers. The layer with the sparse metal conductive structure may of may not have a further binder or other components within the layer. A viscoelastic polymer layer is generally located neighboring, e.g., near or adjacent, the layer comprising the sparse metal conductive structure. One or more non-elastic thermoplastic layers can provide mechanical strength and durability to the structure. Heating of the thermoplastic layer during formation provides for contouring of that layer upon heating and corresponding mechanical stabilization of the film following formation and cooling.

Referring to FIG. 1, representative transparent conductive film 100 comprises a substrate 102, sparse metal conductive layer 104, overcoat layer 106, viscoelastic layer 108 and protective surface layer 110. The total thickness of the transparent conductive film can generally have a thickness from 10 microns to about 3 millimeters (mm), in further embodiments from about 15 microns to about 2.5 mm and in other embodiments from about 25 microns to about 1.5 mm. A person or ordinary skill in the art will recognize that additional ranges of thicknesses within the explicit ranges above are contemplated and are within the present disclosure. In some embodiments, the length and width of the film as produced can be selected to be appropriate for a specific application so that the film can be directly introduced for further processing into a product. In additional or alternative embodiments, a width of the film can be selected for a specific application, while the length of the film can be long with the expectation that the film can be cut to a desired length for use. For example, the film can be in long sheets or a roll. Similarly, in some embodiments, the film can be on a roll or in another large standard format and elements of the film can be cut according to a desired length and width for use.

Substrate 102 generally comprises a durable support layer formed from an appropriate polymer or polymers. In some embodiments, the substrate can has a thickness from about 20 microns to about 1.5 mm, in further embodiments from about 35 microns to about 1.25 mm and in additional embodiments from about 50 microns to about 1 mm. A person of ordinary skill in the art will recognize that additional ranges of thicknesses of the substrate within the explicit ranges above are contemplated and are within the present disclosure. Suitable optically clear polymers with very good transparency, low haze and good protective abilities can be used for the substrate. Suitable polymers include, for example, polyethylene terephthalate (PET), polyethylene naphthalate (PEN), polyacrylate, poly(methyl methacrylate), polyolefin, polyvinyl chloride, fluoropolymer, polyamide, polyimide, polysulfone, polysiloxane, polyetheretherketone, polynorbornene, polyester, polystyrene, polyurethane, polyvinyl alcohol, polyvinyl acetate, acrylonitrile-butadiene-styrene copolymer, polycarbonate, copolymers thereof or blend thereof or the like. Suitable commercial polycarbonate substrates include, for example, MAKROFOL SR243 1-1 CG, commercially available from Bayer Material Science; TAP® Plastic, commercially available from TAP Plastics; and LEXAN™ 8010CDE, commercially available from SABIC Innovative Plastics. Protective surface layer 110 can independently have a thickness and composition covering the same thickness ranges and composition ranges as the substrate as described in this paragraph above.

Optional overcoat 106 can be placed over sparse metal conductive layer 104. Optional overcoat 106 can comprise a curable polymer, e.g., heat curable or radiation curable polymers. Suitable polymers for overcoat 104 are described below as binders for inclusion in the metal nanowire inks, and the list of polymers, corresponding cross linking agents and additives apply equally to optional overcoat 106 without repeating the discussion explicitly here. Overcoat 106 can have a thickness from about 25 nm to about 2 microns, in further embodiments from about 40 nm to about 1.5 microns and in additional embodiments from about 50 nm to about 1 micron. A person of ordinary skill in the art will recognize that additional ranges of overcoat thickness within the explicit ranges above are contemplated and are within the present disclosure.

Viscoelastic materials have both viscous and elastic properties. Viscoelastic polymer layer 108 can have a thickness from about 10 microns to about 500 microns, in further embodiments from about 15 microns to about 400 microns and in other embodiments from about 20 microns to about 300 microns. A person of ordinary skill in the art will recognize that additional ranges of thicknesses of viscoelastic layers within the explicit ranges above are contemplated and are within the present disclosure. Suitable viscoelastic polymers include optically clear adhesives, which can be contact adhesives. Optically clear adhesives include coatable compositions and adhesive tapes. UV curable liquid optically clear adhesives are available based on acrylic or polysiloxane chemistries. Suitable adhesive tapes are available commercially, for example, from Lintec Corporation (MO series); Saint Gobain Performance Plastics (DF713 series); Nitto Americas (Nitto Denko)(LUCIACS CS9621T and LUCIAS CS9622T); DIC Corporation (DAITAC LT series OCA, DAITAC WS series OCA and DAITAC ZB series); PANAC Plastic Film Company (PANACLEAN series); Minnesota Mining and Manufacturing (3M, Minnesota U.S.A.—product numbers 8146, 8171, 8172, 8173 and similar products) and Adhesive Research (for example product 8932).

The amount of nanowires delivered onto the substrate for sparse metal conductive layer 104 can involve a balance of factors to achieve desired amounts of transparency and electrical conductivity. While thickness of the nanowire network can in principle be evaluated using scanning electron microscopy, the network can be relatively sparse to provide for optical transparency, which can complicate the measurement. In general, the sparse metal conductive structure, e.g., fused metal nanowire network, would have an average thickness of no more than about 5 microns, in further embodiments no more than about 2 microns and in other embodiments from about 10 nm to about 500 nm. However, the sparse metal conductive structures are generally relatively open structures with significant surface texture on a submicron scale, and only indirect methods can generally be used to estimate the thickness. The loading levels of the nanowires can provide a useful parameter of the network that can be readily evaluated, and the loading value provides an alternative parameter related to thickness. Thus, as used herein, loading levels of nanowires onto the substrate is generally presented as milligrams of nanowires for a square meter of substrate. In general, the nanowire networks can have a loading from about 0.1 milligrams (mg)/m$^2$ to about 300 mg/m$^2$, in further embodiments from about 0.5 mg/m$^2$ to about 200 mg/m$^2$, and in other embodiments from about 1 mg/m$^2$ to about 150 mg/m$^2$. A person of ordinary skill in the art will recognize that additional ranges of thickness and loading within the explicit ranges above are contemplated and are within the present disclosure. If the sparse metal conductive layer is patterned, the thickness and loading discussion applies only to the regions where metal is not excluded or significantly diminished by the patterning process.

Generally, within the total thicknesses above, layers 102, 104, 106, 108, 110 can be subdivided into sub-layers, for example, with different compositions than each other. Thus, more complex layer stacks can be formed. Sub-layers may or may not be processed similarly to other sub-layers within a particular layer, for example, one sub-layer can be laminated while another sub-layer can be coated and cured.

Processing to Form Transparent Electrically Conductive Films and Film Structure

In general, suitable substrates can be selected as desired based on the particular application as well as suitability for a selected processing approach. For formation applications, a polymer substrate generally is reasonably flexible and has a glass transition temperature $T_G$ suitable for the formation process so that the substrate conforms and facilitates securing the film following formation. Generally, an initial substrate sheet can be used to support the film stack during assembly. The sparse metal conductive layer can be placed directly on a single layer substrate, or one or more initial polymer sublayers can be placed on an initial substrate sublayer to build a multi-layer substrate onto which the sparse metal conductive layer is placed. Formation of a sparse metal conductive layer comprising a metal nanostructured network is described in detail below.

In some embodiments, the film can comprise a polymer overcoat placed on the sparse metal conductive layer, and the overcoat polymers can comprise the polymers listed for the substrates above as well as polymer binders described below for inclusion in the sparse metal conductive layer. A polymer overcoat layer can be particularly suitable for a patterned sparse metal conductive layer to even the surface. The polymer overcoat layer can be applied using appropriate liquid/solution coating or deposition approaches, such as spray coating, spin coating, knife edge coating, dip coating, printing approaches or the like as well as other processing approaches such as extrusion, lamination, calendering, melt coating techniques or the like. The polymer overcoat can be heat cured, radiation cured or the like based on the composition selected. Furthermore, the overcoat layer can be deposited on the conductive or patterned film after trace electrodes are deposited to allow for electrical conductivity to be maintained between the transparent conductive layer and the silver (or other) bus bars. The overcoats may or may not cover the entire substrate surface, and gaps in the overcoats can provide for electrical connection to the transparent electrode. In general, the polymers can be selected for the overcoat to have good optical transparency.

While a protective surface layer can be deposited using solution coating techniques or the like, convenient process approaches for applying the protective surface layer generally comprise extrusion, lamination, calendering, melt coating techniques or the like.

Metal Nanostructured Networks and Forming Fused Metal Nanowires

The electrically conductive core of the formable transparent conductive films described herein comprises sparse metal conductive layers, which can be effectively formed from metal nanowires. In embodiments of particular interest, the electrically conductive core can comprise a metal nanostructured network formed by fusing metal nanowires. In alternative or additional embodiments, the metal nanowires can be physically joined, e.g., with pressure, to lower junction resistance between adjacent metal nanowires. Other nanostructured metal layers can in principle be used in the films. It is expected that the stabilized film structures described herein can facilitate formation with desirable results for films with various sparse metal conductive structures. However, desirable film properties have been obtained with fusing of metal nanowires using commercially available nanowires, so the following discussion focuses on metal nanostructured networks formed from fused metal nanowires.

As summarized above, several practical approaches have been developed to accomplish the fusing. The metal loading can be balanced to achieve desirable levels of electrical conductivity with good optical properties. In general, the metal nanowire processing can be accomplished through deposition of two inks with the first ink comprising the metal nanowires and the second ink comprising a fusing composition, or through the deposition of an ink that combines the fusing elements into the metal nanowire dispersion. The inks may or may not further comprise additional processing aids, binders or the like. Suitable patterning approaches can be selected to be suitable for the particular ink system.

In general, one or more solutions or inks for the formation of the metal nanostructured network can collectively comprise well dispersed metal nanowires, a fusing agent, and optional additional components, for example, a polymer binder, a crosslinking agent, a wetting agent, e.g. a surfactant, a thickener, a dispersant, other optional additives or combinations thereof. For embodiments of inks with metal nanowires separate from the fusing agent, the solvent for the metal nanowire ink can comprise an aqueous solvent, an organic solvent or mixtures thereof. In particular, suitable solvents include, for example, water, alcohols, ketones, esters, ethers, such as glycol ethers, aromatic compounds, alkanes, and the like and mixtures thereof. Specific solvents include, for example, water, ethanol, isopropyl alcohol, isobutyl alcohol, tertiary butyl alcohol, methyl ethyl ketone, glycol ethers, methyl isobutyl ketone, toluene, hexane, ethyl acetate, butyl acetate, ethyl lactate, PGMEA (2-methoxy-1-methylethylacetate), or mixtures thereof. While the solvent should be selected based on the ability to form a good dispersion of metal nanowires, the solvents should also be compatible with the other selected additives so that the additives are soluble in the solvent. For embodiments in which the fusing agent is included in a single solution with the metal nanowires, the solvent can be a significant component of the fusing solution, such as alcohols, as described further below and can be selected accordingly.

The metal nanowire ink, in either a one ink or two ink configuration, can include from about 0.01 to about 1 weight percent metal nanowires, in further embodiments from about 0.02 to about 0.75 weight percent metal nanowires and in additional embodiments from about 0.04 to about 0.5 weight percent metal nanowires. A person of ordinary skill in the art will recognize that additional ranges of metal nanowire concentrations within the explicit ranges above are contemplated and are within the present disclosure. The concentration of metal nanowires influences the loading of metal on the substrate surface as well as the physical properties of the ink.

In general, the nanowires can be formed from a range of metals, such as silver, gold, indium, tin, iron, cobalt, platinum, palladium, nickel, cobalt, titanium, copper and alloys thereof, which can be desirable due to high electrical conductivity. Commercial metal nanowires are available from Sigma-Aldrich (Missouri, USA), Cangzhou Nano-Channel Material Co., Ltd. (China), Blue Nano (North Carolina, U.S.A.), EMFUTUR (Spain), Seashell Technologies (California, U.S.A.), Nanocomposix (U.S.A.), ACS Materials (China), KeChuang Advanced Materials (China), and Nanotrons (USA). Silver in particular provides excellent electrical conductivity, and commercial silver nanowires are available. To have good transparency and low haze, it is desirable for the nanowires to have a range of small diameters. In particular, it is desirable for the metal nanowires to have an average diameter of no more than about 250 nm, in further embodiments no more than about 150 nm, and in other embodiments from about 10 nm to about 120 nm. With respect to average length, nanowires with a longer length are expected to provide better electrical conductivity within a network. In general, the metal nanowires can have an average length of at least a micron, in further embodiments, at least 2.5 microns and in other embodiments from about 5 microns to about 100 microns, although improved synthesis techniques developed in the future may make longer nanowires possible. An aspect ratio can be specified as the ratio of the average length divided by the average diameter, and in some embodiments, the nanowires can have an aspect ratio of at least about 25, in further embodiments from about 50 to about 10,000 and in additional embodiments from about 100 to about 2000. A person of ordinary skill in the art will recognize that additional ranges of nanowire dimensions within the explicit ranges above are contemplated and are within the present disclosure.

Polymer binders and the solvents are generally selected consistently such that the polymer binder is soluble or dispersible in the solvent. In appropriate embodiments, the metal nanowire ink generally comprises from about 0.02 to about 5 weight percent binder, in further embodiments from about 0.05 to about 4 weight percent binder and in additional embodiments from about 0.1 to about 2.5 weight percent polymer binder. In some embodiments, the polymer binder comprises a crosslinkable organic polymer, such as a radiation crosslinkable organic polymer and/or a heat curable organic binder. To facilitate the crosslinking of the binder, the metal nanowire ink can comprise in some embodiments from about 0.0005 wt % to about 1 wt % of a crosslinking agent, in further embodiments from about 0.002 wt % to about 0.5 wt % and in additional embodiments from about 0.005 to about 0.25 wt %. The nanowire ink can optionally comprise a rheology modifying agent or combinations thereof. In some embodiments, the ink can comprise a wetting agent or surfactant to lower the surface tension, and a wetting agent can be useful to improve coating properties. The wetting agent generally is soluble in the solvent. In some embodiments, the nanowire ink can comprise from about 0.01 weight percent to about 1 weight percent wetting agent, in further embodiments from about 0.02 to about 0.75 weight percent and in other embodiments from about 0.03 to about 0.6 weight percent wetting agent. A thickener can be used optionally as a rheology modifying agent to stabilize the dispersion and reduce or eliminate settling. In some embodiments, the nanowire ink can comprise optionally from about 0.05 to about 5 weight percent thickener, in further embodiments from about 0.075 to about 4 weight percent and in other embodiments from about 0.1 to about 3 weight percent thickener. A person of ordinary skill in the art will recognize that additional ranges of binder, wetting agent and thickening agent concentrations within the explicit ranges above are contemplated and are within the present disclosure.

A range of polymer binders can be suitable for dissolving/dispersing in a solvent for the metal nanowires, and suitable binders include polymers that have been developed for coating applications. Hard coat polymers, e.g. radiation curable coatings, are commercially available, for example as hard coat materials for a range of application, that can be selected for dissolving in aqueous or non-aqueous solvents. Suitable classes of radiation curable polymers and/or heat curable polymers include, for example, polyurethanes, acrylic resins, acrylic copolymers, cellulose ethers and esters, polyethers, polyesters, epoxy containing polymers, and mixtures thereof. Examples of commercial polymer binders include, for example, NEOCRYL® brand acrylic resin (DMS NeoResins), JONCRYL® brand acrylic copolymers (BASF Resins), ELVACITE® brand acrylic resin (Lucite International), SANCURE® brand urethanes (Lubrizol Advanced Materials), cellulose acetate butyrate polymers (CAB brands from Eastman™), BAYHYDROL™ brand polyurethane dispersions (Bayer Material Science), UCECOAT® brand polyurethane dispersions (Cytec Industries, Inc.), MONWITOL® brand polyvinyl butyral (Kuraray America, Inc.), cellulose ethers, e.g. ethyl cellulose or hydroxypropyl methyl cellulose, polyvinyl acetates, mixtures thereof, and the like. The polymer binders can be self-crosslinking upon exposure to radiation, and/or they can be crosslinked with photoinitiator or other crosslinking agent. In some embodiments, photocrosslinkers may form radicals upon exposure to radiation, and the radicals then induce crosslinking reactions based on radical polymerization mechanisms. Suitable photoinitiators include, for example, commercially available products, such as IRGACURE® brand (BASF), GENOCURE™ brand (Rahn USA Corp.), and DOUBLECURE® brand (Double Bond Chemical Ind., Co, Ltd.), combinations thereof or the like.

Wetting agents can be used to improve the coatability of the metal nanowire inks as well as the quality of the metal nanowire dispersion. In particular, the wetting agents can lower the surface energy of the ink so that the ink spreads well onto a surface following coating. Wetting agents can be surfactants and/or dispersants. Surfactants are a class of materials that function to lower surface energy, and surfactants can improve solubility of materials. Surfactants generally have a hydrophylic portion of the molecule and a hydrophobic portion of the molecule that contributes to its properties. A wide range of surfactants, such as nonionic surfactants, cationic surfactant, anionic surfactants, zwitterionic surfactants, are commercially available. In some embodiments, if properties associated with surfactants are not an issue, non-surfactant wetting agents, e.g., dispersants, are also known in the art and can be effective to improve the wetting ability of the inks. Suitable commercial wetting agents include, for example, COATOSIL™brand epoxy functionalized silane oligomers (Momentum Performance Materials), SILWET™ brand organosilicone surfactant (Momentum Performance Materials), THETAWET™ brand short chain non-ionic fluorosurfactants (ICT Industries, Inc.), ZETASPERSE® brand polymeric dispersants (Air Products Inc.), SOLSPERSE® brand polymeric dispersants (Lubrizol), XOANONS WE-D545 surfactant (Anhui Xoanons Chemical Co., Ltd), EFKA™ PU 4009 polymeric dispersant (BASF), MASURF FP-815 CP, MASURF FS-910 (Mason Chemicals), NOVEC™ FC-4430 fluorinated surfactant (3M), mixtures thereof, and the like.

Thickeners can be used to improve the stability of the dispersion by reducing or eliminating settling of the solids from the metal nanowire inks. Thickeners may or may not significantly change the viscosity or other fluid properties of the ink. Suitable thickeners are commercially available and include, for example, CRAYVALLAC™ brand of modified urea such as LA-100 (Cray Valley Acrylics, USA), polyacrylamide, THIXOL™ 53L brand acrylic thickener, COAPUR™ 2025, COAPUR™ 830W, COAPUR™ 6050, COAPUR™ XS71 (Coatex, Inc.), BYK® brand of modified urea (BYK Additives), Acrysol DR 73, Acrysol RM-995, Acrysol RM-8W (Dow Coating Materials), Aquaflow NHS-300, Aquaflow XLS-530 hydrophobically modified polyether thickeners (Ashland Inc.), Borchi Gel L 75 N, Borchi Gel PW25 (OMG Borchers), and the like.

Additional additives can be added to the metal nanowire ink, generally each in an amount of no more than about 5 weight percent, in further embodiments no more than about 2 weight percent and in further embodiments no more than about 1 weight percent. Other additives can include, for example, anti-oxidants, UV stabilizers, defoamers or anti-foaming agents, anti-settling agents, viscosity modifying agents, or the like.

As noted above, fusing of the metal nanowires can be accomplished through various agents. Without wanting to be limited by theory, the fusing agents are believed to mobilize metal ions, and the free energy seems to be lowered in the fusing process. Excessive metal migration may lead in some embodiments to a degeneration of the optical properties, so desirable results can be achieved through a shift in equilibrium in a reasonably controlled way, generally for a short period of time, to generate sufficient fusing to obtain desired electrical conductivity while maintaining desired optical properties. In some embodiments, initiation of the fusing process can be controlled through a partial drying of the solutions to increase concentrations of the components, and quenching of the fusing process can be accomplished, for example, through rinsing or more completing drying of the metal layer. The fusing agent can be incorporated into a single ink along with the metal nanowires. The one ink solution can provide appropriate control of the fusing process. Thus, the fusing solution can be a separate solution or a portion of the nanowire dispersion, and the following discussion of fusing solutions follows regardless of the separate nature or combined nature of the solution unless indicated otherwise explicitly or implicitly, for example vapor based fusing.

In general, fusing can be performed using an acid halide vapor and/or a solution based fusing agent. In relevant embodiments, an initial metal nanowires films or coatings can be fused with a fusing solution that can comprise chemical fusing agents, such as halide anions, alkaline pH, reducing agents or a combination thereof. In additional or alternative embodiments, chemical fusing agents are combined into the metal nanowire dispersion. With respect to fusing induced by dissolved halide anions, the solution can comprise dissolved acid halide, dissolved metal halide salts or a combination thereof. Suitable compositions for forming the halide solutions include, for example, HCl, HBr, HF, LiCl, CsCl, NaF, NaCl, NaBr, NaI, KCl, $MgCl_2$, $CaCl_2$, $AlCl_3$, $NH_4Cl$, $NH_4F$, AgF, or a combination thereof. In particular, NaCl, NaBr, and AgF have been observed under some conditions to provide particularly desirable fusing properties. Fusing solutions for separate application of the halide anion fusing agents generally comprise halide ions at concentrations of at least about 0.01 mM, in some embodiments, from about 0.1 mM to about 10M, in further embodiments from about 0.1 M to about 5 M. A person of ordinary skill in the art will recognize that additional ranges of concentration within the explicit ranges above are contemplated and are within the present disclosure.

For embodiments based on fusing with a reducing agent, metal ions in solution are believed to deposit to fuse the wires, and metal ions can be generated from the metal nanowires or added separately. Metal ions can be generated from the metal nanowires with an oxidizing agent, such as an acid. Regardless of the source of the metal ions in solution, the reducing agent can be effective to deposit metal at junction locations of adjacent metal nanowires to fuse adjacent metal nanowires to form the fused nanostructured network. Moreover, once metal ions are present, they can diffuse to areas between nanowires and can be reduced at junctions between nanowires, which result in an electrochemical Ostwald-type ripening since deposition at the junction points can be thermodynamically more favorable than deposition along the wire segments. A metal salt added to the fusing solution can comprise the same metal element or a different metal element relative to the initial metal nanowires added to the network. In this way, the joints of the fused nanostructured network can comprise the same or different metals of the initial metal nanowire components incorporated into the network. In some embodiments, it may be desirable for the joints to be formed from a different metal than the metal nanowire components that are fused into the nanostructure.

A suitable reducing agent should be able to drive the reduction of a metal ion to its elemental form: $M^{a+} \rightarrow M^0$, where M is the selected metal, "a" is the oxidation state of the metal cation and $M^0$ indicates the elemental form of the metal. It has been found that a mild reducing agent, such as certain organic compounds, can be sufficient to drive the fusing process. For example, an alcohol solvent, such as ethanol, can drive the fusing for at least some metals. The results herein suggest that the reduced metal tends to preferentially deposit at junction points of adjacent metal nanowires to facilitate formation of the fused metal nanostructured network. Selected reducing agents can be in high concentrations, for example as the solvent or a component of a solvent mixture or as a solute at a selected concentration. Various alcohols can be used as suitable reducing agents for silver, palladium, and copper. In particular, ethanol and propylene glycol have been found to be effective for the reduction of metals to form the fused metal networks. Alcohols can be oxidized to aldehydes/ketones or to carboxylic acids while correspondingly reducing the metal cations. Alternatively other reducing agents, such as organic or inorganic reducing agents can be added to the fusing solution at an appropriate concentration.

Combined systems can involve a fusing solution comprising metal halides and a reducing agent. These systems are observed to form metal halide shells over the fused metal nanostructure network. Presumably, these systems can have fusing of junctions through one or both mechanisms.

In circumstances in which the metal ions for fusing of the metal network are supplied from metal nanowire components, the fusing solution generally comprises both an oxidizing agent and a reducing agent. With respect to in situ generation of metal cations, an oxidizing acid, such as nitric acid can be used to etch, i.e., oxidize, the metal nanowires to generate metal cations. The presence of oxidizing agents and reducing agents within the solution in some sense buffers the redox (reduction-oxidation) potential of the system, and the redox agents can be balanced to achieve desired results. An excess of oxidizing agents can etch the metal more than desired, and too strong of an oxidizing agent may quench the reduction of the metal so that no fusing may occur without a separate metal ion source. If the oxidation agent and the reducing agent are reasonably balanced, metal can be etched to supply metal ions into the solution, and the reducing agent reduces the metal ions to form elemental metal that evidently preferentially accumulates at junction points of adjacent metal nanowires. During the ripening process, metal migrates gradually from the metal wires to form fused junctions. Thus, it has been observed in some embodiments that there is a net metal migration from the metal nanowire segments of the lattice to the joints of the network. While not wanting to be limited by theory, this observation strongly suggests a decrease in free energy through the migration of metal to the joints from the connected segments. The rate of fusing may be influenced by the balance of the oxidizing and reducing agents. The process can be appropriately quenched following a desired degree of fusing of the joints of the fused metal network. Quenching can be accomplished, for example, through drying, rinsing, dilution or other reasonable approaches.

In some embodiments, with respect to fusing of the metal nanowires based on reduction/oxidation chemistry, the fusing solution generally comprises a reducing agent, a metal ion source, and generally an acid, which can be an oxidizing acid. While an acid may not be contributing significantly to the fusing process, acids have been found to stabilize the fusing solutions. Various solvents and combination of solvents can be used for the fusing solutions described herein. The table below provides a list of solvent with properties of the solvents outlined in detail, and additional solvents include, for example, methanol, butanediol, hydroxylacetone, mixtures thereof, mixtures with the solvents in the following table and mixtures of solvents listed in the table.

| Name | Structure | Boiling Point (° C.) | Density (g/cm³) | Viscosity (cP) | Polarity Index (H₂O = 9)/ Dipole Moment (D) | Surface Tension (mN/m) |
|---|---|---|---|---|---|---|
| Ethanol |  | 78 | 0.79 | 1.0 (20° C.) | 5.2 | 22.0 |
| IPA |  | 83 | 0.79 | 1.96 (25° C.) | 3.9 | 21.7 |
| 1-Butanol |  | 119 | 0.81 | 2.94 (20° C.) | 4 | 24.2 |

-continued

| Name | Structure | Boiling Point (° C.) | Density (g/cm$^3$) | Viscosity (cP) | Polarity Index (H$_2$O = 9)/ Dipole Moment (D) | Surface Tension (mN/m) |
|---|---|---|---|---|---|---|
| 2-Butanol | OH | 99 | 0.81 | 3.7 (25° C.) | <4 | 23.0 |
| Isobutanol | | 108 | 0.80 | 3.95 (20° C.) | | |
| Propylene Glycol | | 188 | 1.04 | 48.6 (25° C.) | | 36 |

In some embodiments, the fusing solution can comprise a metal salt or a combination thereof. In general, the metal ion in the salt can be the same metal element as the metal element of the nanowires or a different metal element. In general, the metal element can be selected as desired and corresponds with a metal having good electrical conductivity. Suitable metal ions include, for example, ions of silver (Ag$^+$), copper (Cu$^{+2}$), gold (Au$^{+3}$), palladium (Pd$^{+2}$), lead (Pb$^{+2}$), aluminum (Al$^{+3}$), nickel (Ni$^{+2}$ or Ni$^{+3}$), cobalt (Co$^{+2}$ or Co$^{+3}$), zinc (Zn$^{+2}$), iron (Fe$^{+2}$ or Fe$^{+3}$), tin (Sn$^{+2}$ or Sn$^{+4}$), or a mixture thereof. In general, the salts can comprise a halide anion, e.g. (AgF), and/or have an anion to provide desired solubility and/or reactivity. Suitable anions can comprise bases of carboxylic acids, e.g., acetate, trifluoromethane sulfonate (TMS), heptafluorobutyrate (FHB), and hexafluoroantimonate (HFA), combinations thereof or the like. The anion can correspond to an oxidizing acid, e.g., nitrate, perchlorate and/or sulfate, to provide desired functionality to the fusing solution. With respect to fusing solutions comprising metal ions, the fusing solution can comprise metal ions generally from about 0.000001M to about 1M, in further embodiments from about 0.00001M to about 0.1M, and in additional embodiments from about 0.0001M to about 0.01M. In some embodiments, the metal ions can be generated in situ through the oxidation of metal nanowires. A person of ordinary skill in the art will recognize that additional ranges of metal ion concentrations within the explicit ranges above are contemplated and are within the present disclosure.

For systems with reduction/oxidation based fusing, the fusing solution can comprise an acid to adjust the acid concentration or pH. The acid concentration/pH may influence the reduction potentials, solubilities of reactants, solution stabilities and other properties. Generally, the fusing solutions have a pH adjusted through the addition of an acid, and the pH can be from about 0.5 to about 6, in further embodiments from about 1 to about 5.5 and in other embodiments from about 1.5 to about 5. With respect to acid concentrations, an acid, e.g., a strong acid, can be added generally in concentrations at least about 0.000001M, in further embodiments from about 0.0000025M to about 0.05M and in additional embodiments from about 0.000005M to about 0.01M. While not wanting to be limited by theory, the acids may also remove at least some surface coating polymers, such as polyvinylperolidone (PVP) that may be coating commercial nanowires. Suitable acids can include weakly oxidizing acids (i.e., moderate oxidizing activity from H$^+$ ions), such as HCl, phosphoric acid, carboxylic acids, RSO$_3$H (sulfonic acid), polysulfonic acid, or combinations thereof. Suitable strong oxidizing acids generally lower the pH while providing a significant oxidizing agent based on the anion, which can influence the potentials in the fusing solution and can be used to etch metal nanowires as a metal ion source. Suitable strong oxidizing acids include, for example, HNO$_3$ (nitric acid), H$_2$SO$_4$ (sulfuric acid), HClO$_4$ (perchloric acid), mixtures thereof and the like. A person of ordinary skill in the art will recognize that additional ranges of pH and acid concentrations within the explicit ranges above are contemplated and are within the present disclosure.

The reducing agent can be provided as the solvent and/or as an additive to the solvent. For example, some alcohols can be useful as a reducing agent. For the fusing solutions described herein, suitable alcohols include, for example, methanol, ethanol, isopropanol, isobutanol, 2-butanol, propylene glycol, sugars and mixtures thereof. Ethanol can be oxidized to form acetaldehyde or acetate while reducing a metal ion to the elemental metal, and other alcohols can be similarly oxidized when functioning as a reducing agent. When a reducing agent is provided as additive to the solvent, a wide range of organic and inorganic compounds can be used. In general, the reducing power of the compound can be a not very strong one, on the basis that a stable fusing solution is desirable. On the other hand, the reducing agent can be selected to be strong enough to reduce the silver and/or other metal ions to elemental metal under the condition of the fusing step. Inorganic and organometallic compounds, typically metal salts and complexes, can be used when they are soluble in the fusing solution solvent. Useful salts include, for example, nitrate or sulfate salts and complexes of metal ions such as V$^{2+}$, Fe$^{2+}$, Cr$^{2+}$, Sn$^{2+}$, Ti$^{3+}$, and the like. Other inorganic reducing agents useful for fusing solutions are alkaline metal, ammonium or other salts of oxidizable anions, such as sulfite, hydrosulfite, thiosulfate, phosphite, hydrogenphosphite, oxalate, formate, or the like or combinations thereof. Furthermore, nanoparticle suspensions of reducing metal, e.g., zinc, iron, aluminum, magnesium, and the like, may be used in appropriate amount as reducing agents.

Organic reducing agents, in addition to those that also function as solvent, can be used in some embodiments. Suitable organic reducing agents include but not limited to phenolic compounds, such as phenol, aminophenol, hydroquinone, pyrogallol, catechol, phenidone, 4-amino-3-hydroxy-1-naphthalenesulfonic acid, and the like; polyols including sugar alcohols; sugars, such as mono-saccharides and disaccharides; hydroxylamine and derivatives; aldehydes; α-hydroxy carbonyl compounds such as hydroxyketones like benzoin, furoin, hydroxyacetone; hydrazide derivatives such as phthalhydrazide, adipic acid dihydrazide, phenidone, and the like; reduced aromatic compounds such as 1-methyl-1,4-cyclohexadiene, dihydrodiazine, and the like; and combinations thereof. In general, a reducing agent can be incorporated into the fusing solution at a concentration from about 0.001 mM to about 1000 mM, in further embodiments from about 0.01 mM to about 100 mM, and in additional embodiments from about 0.1 mM to about 10 mM, and a desired concentration generally is influenced by the chemistry of a selected agent or combination of agents and a person of ordinary skill in the art can evaluate these issue empirically based on the teachings herein. A person of ordinary skill in the art will recognize that additional ranges of reducing agent concentrations within the explicit ranges above are contemplated and are within the present disclosure. If an organic additive is supplied as a reducing agent, various solvents can be suitable, such as isopropyl alcohol, isobutyl alcohol, formaldehyde, acetone, other ketones, other aldehydes, mixtures thereof, and the like.

Fusing solutions based on alkaline chemistry generally comprise a compound that has an alkaline pH upon dissolving into the solvent. Suitable solvents can be aqueous solvents, such as water or mixtures of water and a solvent soluble in water, or polar organic liquids such as alcohols. Suitable basic compositions can comprise hydroxide compositions, such as ammonium hydroxide, metal hydroxides, or mixtures thereof. Generally, the base compositions are added in an amount to have a pH that is at least about 9.5 pH units, in further embodiments at least about 10 pH units and in other embodiments from about 10.5 pH units to about 13 pH units. With respect to base concentrations, an alkaline composition, e.g., a hydroxide, can be added generally in concentrations at least about 0.00003M, in further embodiments from about 0.00005M to about 0.5M and in additional embodiments from about 0.0001M to about 1M. The alkaline fusing solutions can also advantageously comprise a metal salt. A person of ordinary skill in the art will recognize that additional ranges of alkaline pH and hydroxide concentrations within the explicit ranges above are contemplated and are within the present disclosure. The fusing solutions can also comprise property modifying compositions, which may be useful to provide a solution suitable for a selected delivery approach.

In embodiments of particular interest, a process is used in which a sparse nanowire film is initially deposited and subsequent processing with or without depositing another ink provides for the fusing of the metal nanowires into a metal nanostructured network, which is electrically conducting. The fusing process can be performed with controlled exposure to a fusing vapor and/or through the deposition of a fusing agent in solution. Fused nanostructured metal films are generally formed on a selected substrate surface. In general, the films, both fused and prior to fusing, have good optical properties, including transparency and low haze. The as deposited nanowire film is dried to remove the solvent, which can prepare the film for the addition of a fusing solution or it can drive the fusing process as well as quench the process once sufficient solvent is removed. If a separate fusing ink is deposited, the treated film is dried to similarly drive the fusing process and ultimately quench the fusing process. Processing can be adapted for patterning of the film as described further below.

For the deposition of the metal nanowire ink with or without a fusing agent, any reasonable deposition approach can be used, such as dip coating, spray coating, knife edge coating, bar coating, Meyer-rod coating, slot-die, gravure printing, spin coating or the like. The ink can have properties, such as viscosity, adjusted appropriately with additives for the desired deposition approach. Similarly, the deposition approach directs the amount of liquid deposited, and the concentration of the ink can be adjusted to provide the desired loading of metal nanowires on the surface. After forming the coating with the dispersion, the nanowire network can be dried to remove the liquid. Drying may or may not be performed prior to performing the fusing process if a separate fusing ink is applied.

A first approach to fusing can be performed with acid halide vapor, such as vapor from HCl, HBr, HI or mixtures thereof. HF can also be used, but HF may be corrosive to some substrate materials and is more toxic. Specifically, the dried coating can be exposed to the vapor of the acid halide for a brief period of time. The hydrogen halide compounds are gaseous and are soluble in water and other polar solvents such as alcohol. Generally, the vapor for fusing the metal nanowire film can be generated from a gas reservoir, from vapor given off by solutions of the hydrogen halide compounds, and/or from another source. Acidic vapors can quickly be passed over the coating surfaces for example for about 10 s to form the nanowire network. In general, the coating containing the nanowires can be treated with acid vapor for no more than about 4 minutes, in further embodiments for from about 2 seconds to about 3.5 minutes and in other embodiments from about 5 seconds to about 3 minutes. Also, acid generating compounds, for example photo-acids or photo-acid generators can be incorporated. These chemicals can generate the desired acid (for example HCl) after exposure to irradiation. Such chemistries can thus be used for patterning. Polymeric HCl photogenerators include polychloromethylstyrenes, copoly(chloromethylstyrene-styrene) (e.g., from Sigma-Aldrich), copoly(chloromethylstyrene-acrylated methyl styrene), copoly(chloromethyl styrene-dimethylaminoethylacrylated methyl styrene) or copoly(chloromethylstyrene-trimethylaminoethylacrylated methyl styrene) and the like that can photochemically generate HCl upon exposure to radiation. Also, small molecule HCl photo-releasing compounds are useful such as 2-(4-Methoxystyryl)-4,6-bis(trichloromethyl)-1,3,5-triazine (Sigma-Aldrich). A person of ordinary skill in the art will recognize that additional ranges of treatment times are contemplated and are within the present disclosure.

With respect to the use of a separate fusing solution or solutions, the fusing solution can similarly be applied using any reasonable deposition approach, although different deposition approaches may be more readily useful with respect to the different solutions. Fusing solutions can be deposited, for example, using spray coating, dip coating, spin coating, blade coating, gravure printing, inkjet printing, and the like.

In some embodiments, it is believed that fusing occurs during the drying of the film with the metal nanowires and the fusing agent in which the drying process increases metal ion concentrations. As the material dries, it is believed that liquid can pool to areas of lower chemical potential in the film between nanostructures. The films can be dried, for example, with a heat gun, an oven, a thermal lamp or the like, although the films that can be air dried can be desired in some embodiments. In some embodiments, the films can be heated to temperatures from about 50° C. to about 100° C. during drying. After drying, the films can be washed one or more times, for example, with an alcohol or other solvent or solvent blend, such as ethanol or isopropyl alcohol, to removed excess solids to lower haze. In general, the fusing is believed to be a low temperature process, and any heat application to facilitate drying is incidental to the fusing. Clear evidence can be found in the patterning results in which the heat application does not increase electrical conductivity of regions free of the fusing solution.

Following fusing of the metal nanowires into a network, the individual nanowires generally are no longer present, although the physical properties of the nanowires used to form the network can be reflected in the properties of the fused metal nanostructured network. The metal fusing is believed to contribute to the enhanced electrical conductivity observed and to the good optical properties achievable at low levels of electrical resistance. The fusing is believed to take place at points of near contact of adjacent nanowires during processing. Thus, fusing can involve end-to-end fusing, side wall to side wall fusing and end to side wall fusing. The degree of fusing may relate to the processing conditions. Adjustment of processing conditions can be used to achieve good fusing without degradation of the nanowire network, such that desirable film properties can be achieved.

Patterning can be achieved in several convenient ways. For example, printing of the metal nanowires can directly result in patterning. Additionally or alternatively, lithographic techniques can be used to remove portions of the metal nanowires, prior to or after fusing, to form a pattern. Similarly, selective fusing of the metal nanowires can be effective to pattern the electrical conductivity, and the fusing solution can be patterned with printing or lithographic techniques. As noted in the '833 application cited above, the patterning crosslinking of an overcoat layer can be used to pattern the fusing through controlled effectiveness of the fusing solution penetration. Thus, using a selected approach, the metal nanostructured network can be patterned as desired.

Film Electrical and Optical Properties

The fused metal nanostructured networks can provide low electrical resistance while providing good optical properties. Thus, the films can be useful as transparent conductive electrodes or the like. The transparent conductive electrodes can be suitable for a range of applications such as electrodes along light receiving surfaces of solar cells. For displays and in particular for touch screens, the films can be patterned to provide electrically conductive patterns formed by the film. Corresponding unfused metal nanowire films can have very high electric resistance and good optical properties, while providing a suitable film for fusing into a film with low values of electrical resistance. Patterned films can have a high contrast with respect to the difference in electrical resistance for different sections of the pattern. The substrate with the patterned film, generally has good optical properties at the respective portions of the pattern. However, the visibility of the pattern can vary depending on the patterning approach. In some embodiments, following formation of the films, the properties of the films do not degrade significantly as discussed in more detail in the formation section below.

Electrical resistance of thin films can be expressed as a sheet resistance, which is reported in units of ohms per square ($\Omega/\square$ or ohms/sq.) to distinguish the values from bulk electrical resistance values according to parameters related to the measurement process. Sheet resistance of films is generally measured using a four point probe measurement or an equivalent process. In the Examples below, film sheet resistances were measured using a four point probe, or by making a square using a quick drying silver paste to define a square. The fused metal nanowire networks can have a sheet resistance of no more than about 300 ohms/sq., in further embodiments no more than about 200 ohms/sq., in additional embodiments no more than about 100 ohms/sq. and in other embodiments no more than about 60 ohms/sq. A person of ordinary skill in the art will recognize that additional ranges of sheet resistance within the explicit ranges above are contemplated and are within the present disclosure. Depending on the particular application, commercial specifications for sheet resistances for use in a device may not be necessarily directed to lower values of sheet resistance such as when additional cost may be involved, and current commercially relevant values may be for example, 270 ohms/sq., versus 150 ohms/sq., versus 100 ohms/sq., versus 50 ohms/sq., versus 40 ohms/sq., versus 30 ohms/sq. or less as target limits for different quality touch screens, as well as a variety of other applications. Thus, lower cost films may be suitable for certain applications in exchange for modestly higher sheet resistance values. In general, sheet resistance can be reduced by increasing the loading of nanowires, but an increased loading may not be desirable from other perspectives, and metal loading is only one factor among many for achieving low values of sheet resistance. In a patterned conductive layer, the regions of relatively high electrical resistance can have a sheet resistance that is at least a factor of 100 greater than the sheet resistance in low resistance regions, in further embodiments, at least a factor of 1000 greater, in other embodiments at least a factor of 10,000 greater and in some embodiments at least a factor of 10,000 greater sheet resistance in high resistance regions relative to the sheet resistance in low resistance regions. A person of ordinary skill in the art will recognize that additional ranges of sheet resistance ratios within the explicit ranges above are contemplated and are within the present disclosure.

For applications as transparent conductive films, it is desirable for the fused metal nanowire networks to maintain good optical transparency. In principle, optical transparency is inversely related to the loading with higher loadings leading to a reduction in transparency, although processing of the network can also significantly affect the transparency. Also, polymer binders and other additives can be selected to maintain good optical transparency. The optical transparency can be evaluated relative to the transmitted light through the substrate. For example, the transparency of the conductive film described herein can be measured by using a UV-Visible spectrophotometer and measuring the total transmission through the conductive film and support substrate. Transmittance is the ratio of the transmitted light intensity (I) to the incident light intensity ($I_o$). The transmittance through the film ($T_{film}$) can be estimated by dividing the total transmittance (T) measured by the transmittance through the support substrate ($T_{sub}$). ($T=I/I_o$ and $T/T_{sub}=(I/I_o)/(I_{sub}/I_o)=I/I_{sub}=T_{film}$) Thus, the reported total transmissions can be corrected to remove the transmission through the substrate to obtain transmissions of the film alone. While it is generally desirable to have good optical transparency across the visible spectrum, for convenience, optical transmission can be reported at 550 nm wavelength of light. Alternatively or additionally, transmission can be reported as total transmittance from 400 nm to 700 nm wavelength of light, and such results are reported in the Examples below. In general, for the fused metal nanowire films, the measurements of 550 nm transmittance and total transmittance from 400 nm to 700 nm (or just "total transmittance" for convenience) are not qualitatively different. In some embodiments, the film formed by the fused network has a total transmittance of at least 80%, in further embodiments at least about 85%, in additional embodiments, at least about 90%, in other embodiments at least about 94% and in some embodiments from about 95% to about 99%. Transparency of the films on a transparent polymer substrate can be evaluated using the standard ASTM D1003 ("Standard Test Method for Haze and Luminous Transmittance of Transparent Plastics"), incorporated herein by reference. A person or ordinary skill in the art will recognize that additional ranges of transmittance within the explicit ranges above are contemplated and are within the present disclosure.

Also, the correlation of good optical transparency with low electrical resistance can be particularly desirable. In some embodiments with a sheet resistance from 10 ohms/sq. to about 150 ohms/sq., the films can have a total transmittance of at least about 86%, in further embodiments at least about 88% and in other embodiments from about 90% to about 99%. In further embodiments, the film can have a sheet resistance from about 40 ohms/sq. to about 125 ohms/sq. and a total transmittance from about 91% to about 98.5%. In another embodiment, the film can have a sheet resistance of no more than about 175 ohms/sq. and a total transmittance of at least about 90%. A person or ordinary skill in the art will recognize that additional ranges of optical transmission within the explicit ranges above are contemplated and are within the present disclosure.

The fused metal networks can also have low haze along with high transmission of visible light while having desirably low sheet resistance. Haze can be measured using a hazemeter based on ASTM D1003 referenced above, and the haze contribution of the substrate can be removed to provide haze values of the transparent conductive film. In some embodiments, the sintered network film can have a haze value of no more than about 1.2%, in further embodiments no more than about 1.1%, in additional embodiments no more than about 1.0% and in other embodiments from about 0.9% to about 0.5%. A person of ordinary skill in the art will recognize that additional ranges of haze within the explicit ranges above are contemplated and are within the present disclosure.

Formation and Formable Film Properties

As described herein, transparent conductive films have been developed that provide for formation while maintaining desirable levels of electrical conductivity and optical properties. From a practical perspective, formation can refer to production processes for the formation of products in which a transparent conductive film may be formed around contours of a three dimensional object as well as to protocols for evaluation of films in relevant ways to evaluate their usefulness for formation in the production of products. The parameters of potential formation evaluation can be described in terms of stretching of the film or the bending of a film a specified angle around a corner with a specified radius of curvature. These evaluation protocols provide useful information regarding the films and their expected performance in actual use for formation around products. In the Examples below, fairly stringent testing is performed to evaluate a range of films in terms of their electrical conductivity and optical properties.

Figure 2:
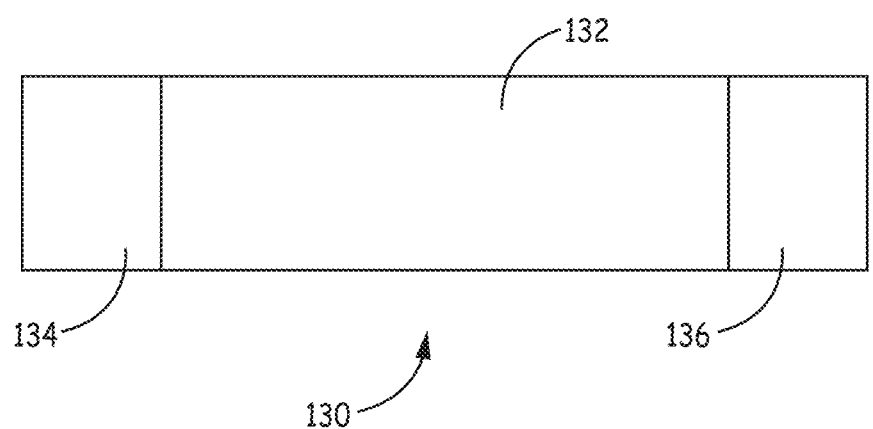
FIG. 2 is a top view of a film sample for testing stretching or bending of the film and effect on sheet resistance.

For stretching and bending studies described in the following, a test film can be used as shown in FIG. 2. Test sample 130 comprises a full stack section 132 and end sections 134, 136. Full stack section 132 can have dimensions of 2 centimeter width and 5 centimeters of length. Stretching can be performed by gripping the film approximately at the edges of the full stack section. End section 134, 136 include the substrate and the sparse metal conductive layer as formed with or without a binder, such as a metal nanostructured network. End sections can be used for sheet resistance measurements without interference from the layers covering the conductive layer. The length of end sections 134, 136 generally is not significant.

Films can be evaluated by stretching. The elongation studies are performed by heating the film to or above the glass transition temperature and then stretching the film. The glass transition temperature depends on the particular composition of the film, for example, the glass transition temperature for polycarbonates generally ranges from about 141° C. to about 149° C. As described in the Examples for particular testing, the films can be heated transiently, for example with a heat gun, heat lamp or other rapid heating device, such that the film is quickly heated above a softening point, stretched and then rapidly cooled through dissipation of the heat. The film may be stretched by hand, or it may be stretched mechanically, but generally the stretching is performed mechanically so that the strain can be measured simultaneously with the stretching. In embodiments where the film is stretched mechanically, the film may be clamped or otherwise secured then the mechanical mechanism would pull the heated film until the desired strain was reached. Strain is calculated by ((final length)−(initial length))/(initial length). The film may be stretched a selected amount, such as to 5%, 10%, 15%, 20%, 30% or more or any other reasonable value at which point selected property measurements can be performed for the film. Strain can be induced by attaching the film with claims to an instrument that strains the film in a controlled way, such as incremental stretches with a stepper motor. Suitable instruments are available from Instron.

For the transparent conductive films, transmission, haze, and sheet resistance can be measured before and after stretching. In general, the sheet resistance before stretching is lower than the resistance after stretching, and the more the film is stretched the higher the resistance. The amount of elongation of the film for evaluation of properties generally can be stopped after the amount of elongation results in a sheet resistance above a cutoff value. See, stretching experiments in the Examples. After stretching to a strain of 20%, the formable transparent conductive films may have a sheet resistance of no more than about 1000Ω/□, in further embodiments no more than about 800Ω/□, and in additional embodiments no more than about 600Ω/□. A person of ordinary sill in the art will recognize that additional ranges within the explicit ranges above are contemplated and are within the present disclosure.

Films can also be evaluated by bending. The bending studies are performed by heating the film to or above the glass transition temperature and then bending the film according to a specified protocol and cooling the film through dissipation of the heat into the ambient. The film may be bent by hand, or it may be bent mechanically. For example, the films can be bent 180° around a radius of curvature of 0.5 mm for useful testing parameters.

In general, when the film is bent the resistance increases, see results in the Examples After stretching films may have a sheet resistance of no more than about 1000Ω/□, in further embodiments no more than about 800Ω/□ and in additional embodiments no more than about 100Ω/□. A person of ordinary sill in the art will recognize that additional ranges of sheet resistance within the explicit ranges above are contemplated and are within the present disclosure.

In general, the transmission and haze is approximately the same before and after bending, stretching and formation generally. Additional results are presented in the examples below in which the film is formed around a mold approximating roughly a cell phone design to mimic the formation around a cell phone for the formation of a three dimensional touch screen. This formation testing provides fairly realistic testing of the formation process with a selection of films. While the examples demonstrate a suitable degree of formation stability for rigorous commercial applications, a lesser degree of formation stability can be commercially useful as well as an advance on the state of the art. Thus, it an be desirable for a formable film to have a sheet resistance of no more than about 500 ohms/sq. or no more than about 250 ohms/sq., when formed along two surfaces at a 60 degree angle with a radius of curvature of no more than about 5 centimeters, in further embodiments the two surfaces have an angle of 90 degrees and in other embodiments at an angle of 90 degrees and with a radius of curvature of no more than 1 centimeter. A person of ordinary skill in the art will recognize that additional ranges of sheet resistance, angles and radius of curvature within the explicit ranges above are contemplated and are within the present disclosure.

Films with these properties can be incorporated into a range of three dimensional products. In some embodiments the film is molded around the product. In other embodiments the film is molded separately and then incorporated into the product. The film may be in contact with portions of two or more surfaces of the product. In order to mold the product the film may be heated as described above in order to bend or stretch the film into the desired shape. If a mold is used the film may be placed in a heated mold then shaped by pressure and/or additional localized heat. The incorporated film may have any of the attributes described above.

While it can be useful to consider the properties of the sparse metal conductive layer, e.g., the nanostructured metal network formed from fused nanowires, the full formable films have optical properties of the full film that are significant considerations for their use. Thus, the full films can have a total transmittance of visible light of at least about 80%, in further embodiments at least about 85% and in further embodiments at least about 90%. In some embodiments, the film can have a haze of no more than about 1.5%, in further embodiments no more than about 1.2% and in other embodiments no more than about 1%, although a low haze may not be significant for all applications. A person of ordinary skill in the art will recognize that additional ranges of optical properties for the formable films within the explicit ranges above are considered and are within the present disclosure.

Touch Sensors

Figure 3:
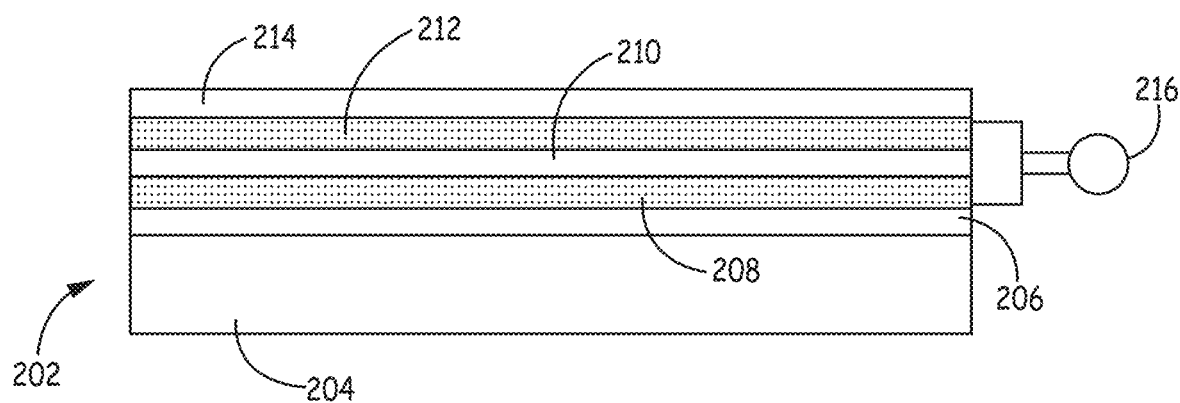
FIG. 3 is a schematic diagram showing a capacitance based touch sensor.
Figure 4:
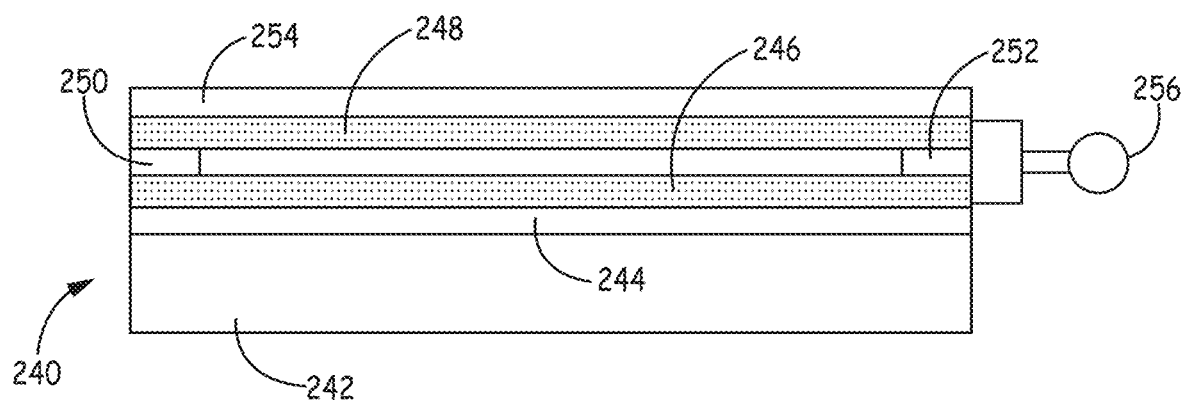
FIG. 4 is a schematic diagram showing a resistance based touch sensor.

The transparent conductive films described herein can be effectively incorporated into touch sensors that can be adapted for touch screens used for many electronic devices. As described herein, the transparent conductive films are formable around three dimensional structure, but to simplify the current discussion of touch sensors, the potential curvature is not discussed, although it can be understood that the structures of the schematic touch sensors below are not necessarily planar. Also, some representative embodiments are generally described here, but the transparent conductive films can be adapted for other desired designs. A common feature of the touch sensors generally is the presence of two transparent conductive electrode structures in a spaced apart configuration in a natural state, i.e., when not being touched or otherwise externally contacted. For sensors operating on capacitance, a dielectric layer is generally between the two electrode structures. Referring to FIG. 3, a representative capacitance based touch sensor 202 comprises a display component 204, an optional bottom substrate 206, a first transparent conductive film 208 (first electrode), a dielectric layer 210, such as a polymer or glass sheet, a second transparent conductive film 212 (second electrode), optional top cover 214, and measurement circuit 216 that measures capacitance changes associated with touching of the sensor. Referring to FIG. 4, a representative resistance based touch sensor 240 comprises a display component 242, an optional lower substrate 244, a first transparent conductive film 246 (first electrode), a second transparent conductive film 248 (second electrode), support structures 250, 252 that support the spaced apart configuration of the electrode structures in their natural configuration, upper cover layer 254 and resistance measuring circuit 256.

Display components 204, 242 can be, for example, LED based displays, LCD displays or other desired display components. Substrates 208, 244 and cover layers 214, 254 can be independently transparent polymer sheets or other transparent sheets. Support structures can be formed from a dielectric material, and the sensor structures can comprise additional supports to provide a desired stable device. Measurement circuits 216, 256 are known in the art. Transparent conductive electrodes 206, 212, 246 and 248 can be effectively formed using fused metal networks, which can be patterned appropriately to form distinct sensors, although in some embodiments the fused metal networks form some transparent electrode structures while other transparent electrode structures in the device can comprise materials such as indium tin oxide, aluminum doped zinc oxide or the like. Fused metal networks can be effectively patterned as described herein, and it can be desirable for patterned films in one or more of the electrode structures to form the sensors such that the plurality of electrodes in a transparent conductive structure can be used to provide position information related to the touching process. The use of patterned transparent conductive electrodes for the formation of patterned touch sensors is described, for example, in U.S. Pat. No. 8,031,180 to Miyamoto et al., entitled "Touch Sensor, Display With Touch Sensor, and Method for Generating Position Data," and published U.S. patent application 2012/0073947 to Sakata et al., entitled "Narrow Frame Touch Input Sheet, Manufacturing Method of Same, and Conductive Sheet Used in Narrow Frame Touch Input Sheet," both of which are incorporated herein by reference.

EXAMPLES

Commercial silver nanowires were used in the following examples with an average diameter of less than 50 nm and an average length of 10-30 microns. The silver nanowires (AgNWs) films were formed using the following procedure. Commercially AgNWs were dispersed in solvent to form an AgNW dispersion. The AgNWs dispersions were typically in the 0.1-1.0 wt % range in an alcohol solvent. The dispersion was then deposited on the surface of a commercial polycarbonate sheet as an AgNWs film by blade coating. The polycarbonate substrate was a 5 mil (thousandths of an inch) thick commercial material. Several similar commercial polycarbonate sheets are available with similar optical properties, generally a TT % from 91% to 93% and a haze generally 0.1% to 0.2%. The AgNWs film either contained a fusing agent or was processed further with a selected fusing agent to form fused metal nanostructured networks. The AgNW films were dried using a heat gun. In some examples the resulting dried AgNW film was cured in an oven at 100° C. for 10 minutes. If the film was processed with a separate fusing ink, the films were then washed or blade treated with AgNO$_3$ in HNO$_3$ and ethanol, with a concentration of Ag$^+$ at about 0.001 mM to 50 mM and a concentration of HNO$_3$ at about 0.001 mM to 50 mM.

Three ink systems were tested. A first ink system referred to as "Bare" had a first AgNW ink without a polymer binder and had a separate fusing solution applied as described in the previous paragraph. A second ink system referred to as "D" had a first AgNW ink with a polymer binder and a separate fusing solution applied as described in the previous paragraph. A third ink system referred to as "G" had a single ink with the fusing compositions mixed with the AgNW dispersion.

For some films, an overcoat of an acrylate based hardcoat polymer in isopropanol at a concentration of 0.75 wt % was applied to the fused AgNW film using a blade coater at roughly 1 mil at a selected speed, which dried into a coating with a thickness on the order of 100 nm. The overcoat was dried using a heat gun and then UV cured at a rate of 1 J/cm$^2$.

Figure 5:
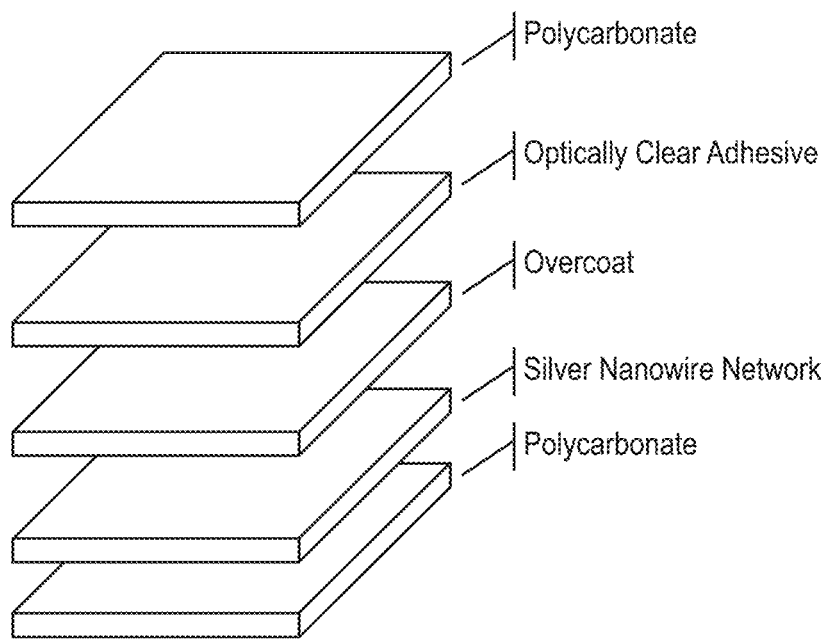
FIG. 5 is an exploded view of a general embodiment of a thermoformable film.

For noted samples, an optically clear adhesive tape was applied to the cured overcoat using a laminator. Five commercial optically clear adhesive (OCA) tapes were tested: 1) 4 mils thick (1 mil is a thousandth of an inch=25.4 microns), 2) 1 mil thick, 3) 2 mils thick, 4) 3 mls thick with a 1 mil polyester carrier film in the middle of the tape, and 5) 1.6 mils thick. OCA tapes 1-4 had acrylic based adhesive polymers and OCA tape 5 had a polydimethylsiloxane based adhesive polymer. For some embodiments, a clear sheet of polycarbonate or of PET was applied as a cap layer to the optically clear adhesive tape using a laminator. The resulting film with all of the layers included is a fused silver nanostructured network with an overcoat layer and an optically clear adhesive layer sandwiched between two layers of polycarbonate, as depicted in FIG. 5.

The total transmission (TT) and haze of the AgNWs film samples were measured using a Haze Meter with films on a polymer substrate. To adjust the haze measurements for the samples below, a value of substrate haze can be subtracted from the measurements to get approximate haze measurements for the transparent conductive films alone. The instrument is designed to evaluate optical properties based on ASTM D 1003 standard ("Standard Test Method for Haze and Luminous Transmittance of Transparent Plastics"), incorporated herein by reference. In general, the optical properties of the film did not change significant following stretching, bending or forming. The full stacks described herein had TT values of 88% to 92% and haze values of 0.5 to 2.

Figure 6:
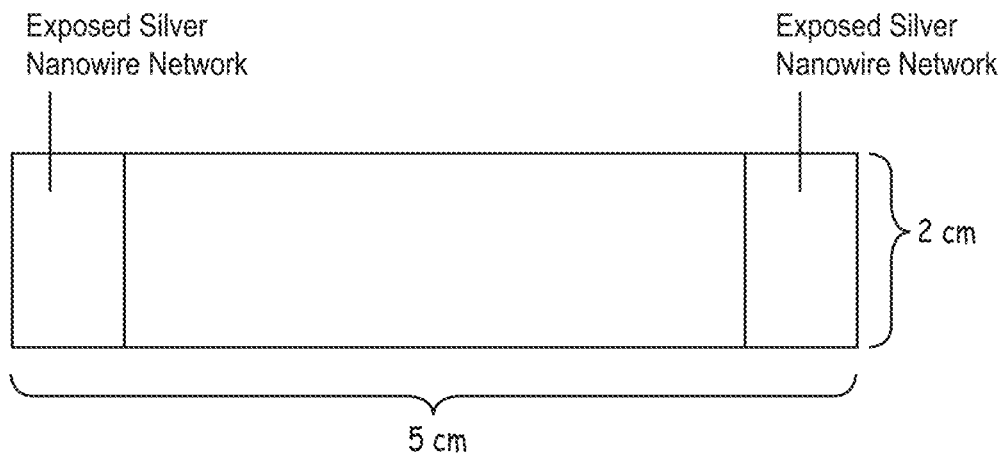
FIG. 6 is a top view of a test sample of a thermoformable film prior to testing.

Resistance measurements were made prior to and after thermoform tests described below. Sheet resistance was measured with a 4-point probe method, a contactless resistance meter or using a square of silver pastes as follows. To make measurements prior to formation, a square of silver paste was sometime used by painting the paste onto the surface of the samples to define a square, or a rectangular shape, which were then annealed at roughly 120° C. for 20 minutes in order to cure and dry the silver paste. Alligator clips were connected to the silver paste, and the leads were connected to a commercial resistance measurement device. Electrical connections are made to exposed end sections of the film, such as shown in FIG. 6. Resistance values were sensitive to formation type manipulations and stabilization of resistance is described in the following examples.

Example 1: Elongation Study

This Example describes the procedure used to test the stability of a set of films with various layer structures upon stretching.

A set of samples were formed with a 5 cm by 2 cm rectangle of a full layer stack with an exposed section of the metal nanostructured network on either end for conductivity measurement as shown in FIG. 6. The samples were formed as described above with four samples made for each of three AgNW ink embodiments, Bare system, G system and D system. For each of these three systems, 4 samples were formed: 1—no overcoat or an optically clear adhesive tape; 2—overcoat and no optically clear adhesive tape; 3—no overcoat but with an optically clear adhesive tape; 4—an overcoat and an optically clear adhesive tape. The OCA for these samples was OCA-4 above.

Figure 7:
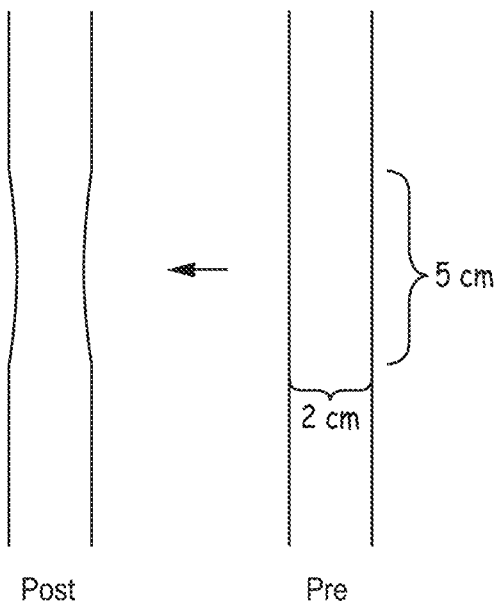
FIG. 7 is a photograph of a thermoformable film before and after it is subject to stretch testing.
Figure 8:
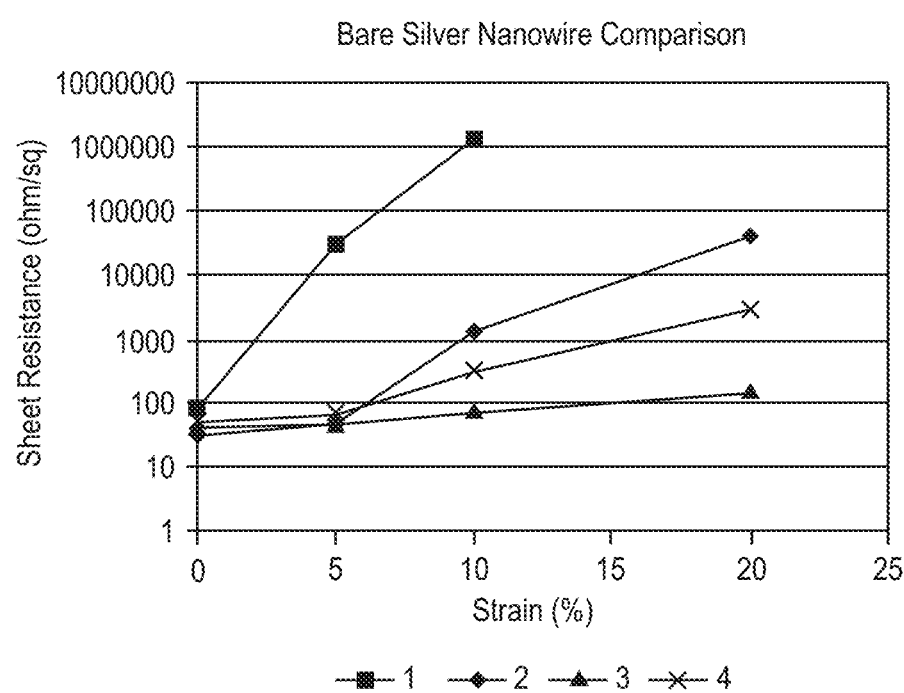
FIG. 8 is a graph depicting the resistance of a series of bare silver nanowire films as determined by the amount of strain placed on the film by stretching.
Figure 9:
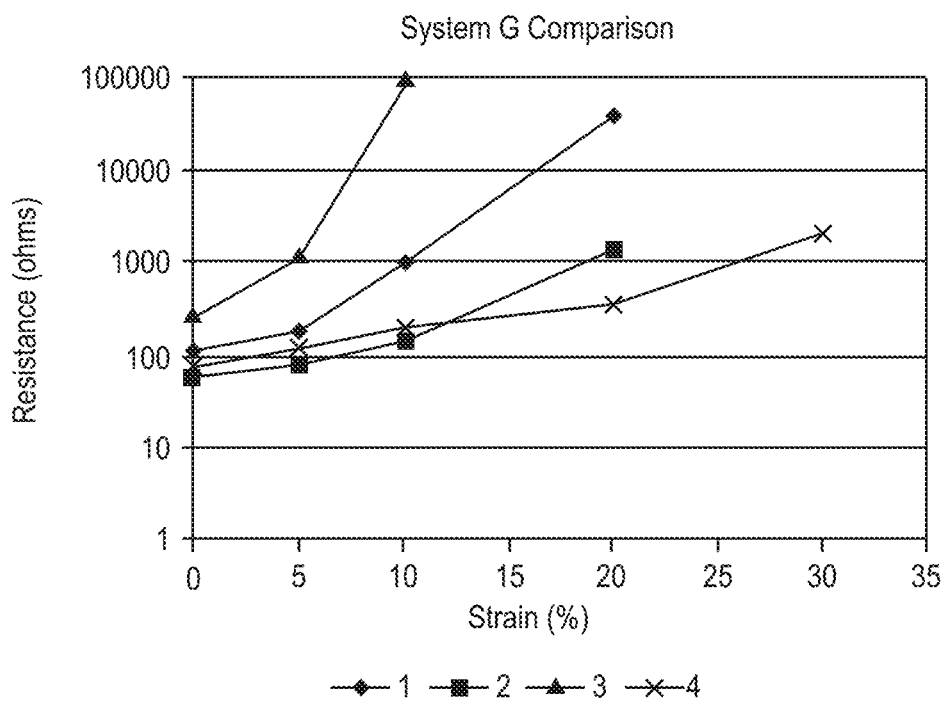
FIG. 9 is a graph depicting the resistance of a series of silver nanowire films containing a hydroxypropyl methylcellulose binder as determined by the amount of strain placed on the film by stretching.
Figure 10:
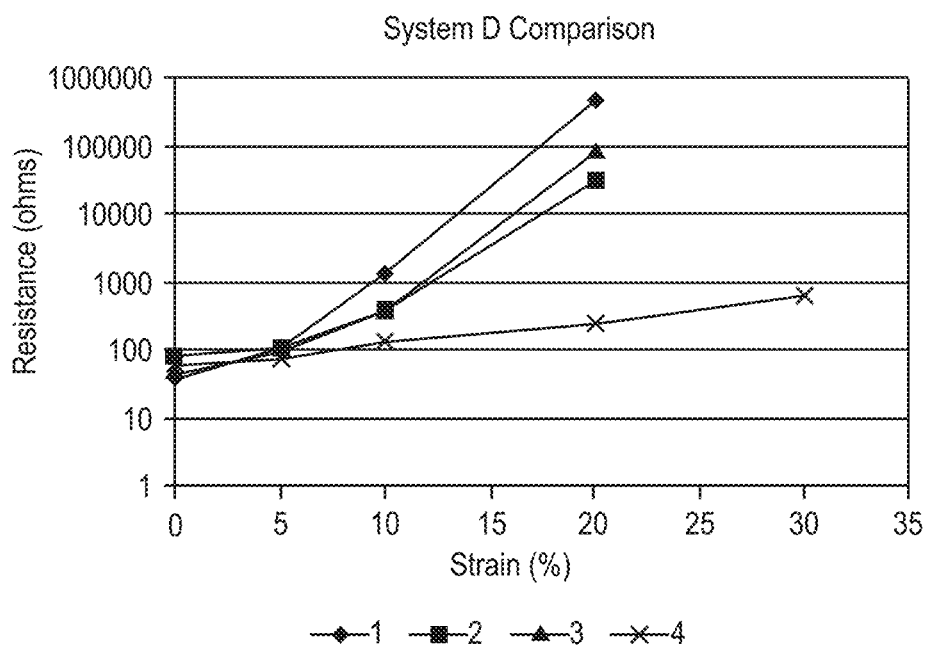
FIG. 10 is a graph depicting the resistance of a series of silver nanowire films containing a polyurethane based binder as determined by the amount of strain placed on the film by stretching.
Figure 11:
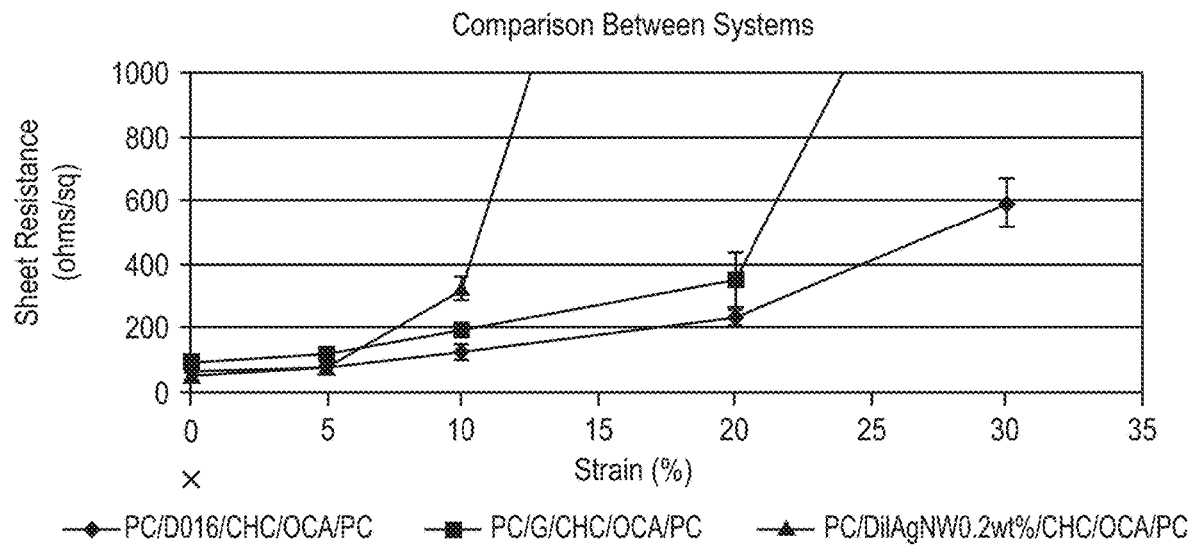
FIG. 11 is a graph depicting the resistance of a series of silver nanowire films from FIG. 8-10 as determined by the amount of strain placed on the film by stretching.

The conductivity of each sample was measured prior to stretching. The sample was then clamped into a stretch tester with the clamp secured around the full stack. A heat gun was used to heat up the film to a temperature above the glass temperature. The stretch tester elongated the heated sample to the designated strain, for example 5%, 10%, 20%, or 30%. The sample was allowed to cool, and the conductivity of the sample was measured again. A representative picture of a sample before and after stretching is shown in FIG. 7. The results are depicted in FIGS. 8-11.

Example 2: Bending Study

This Example describes the procedure used to test the stability of the films with respect to bending.

Figure 12:
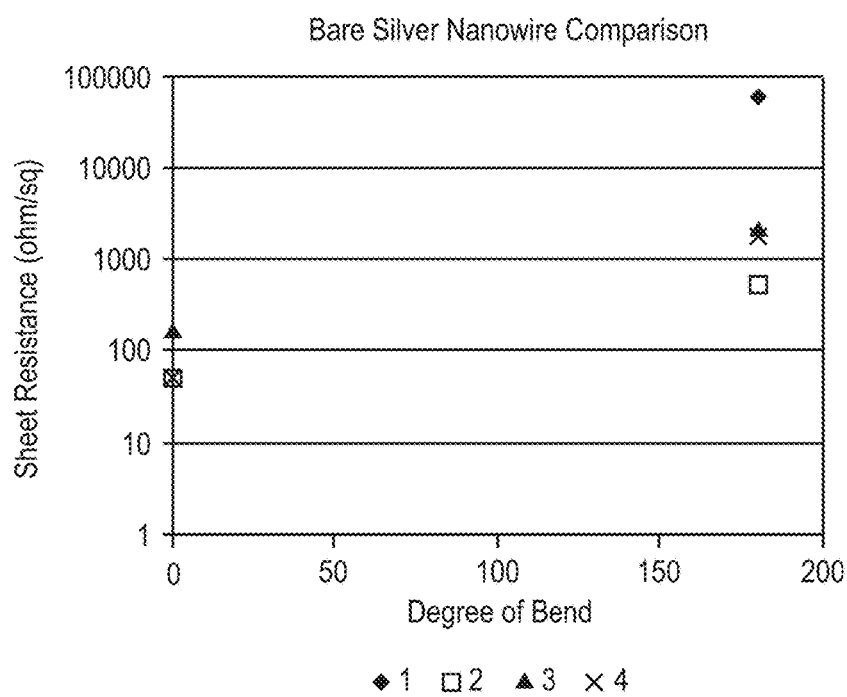
FIG. 12 is a graph depicting the resistance of a series of bare silver nanowire films as determined by the angle of bend of the film after thermoforming.
Figure 13:
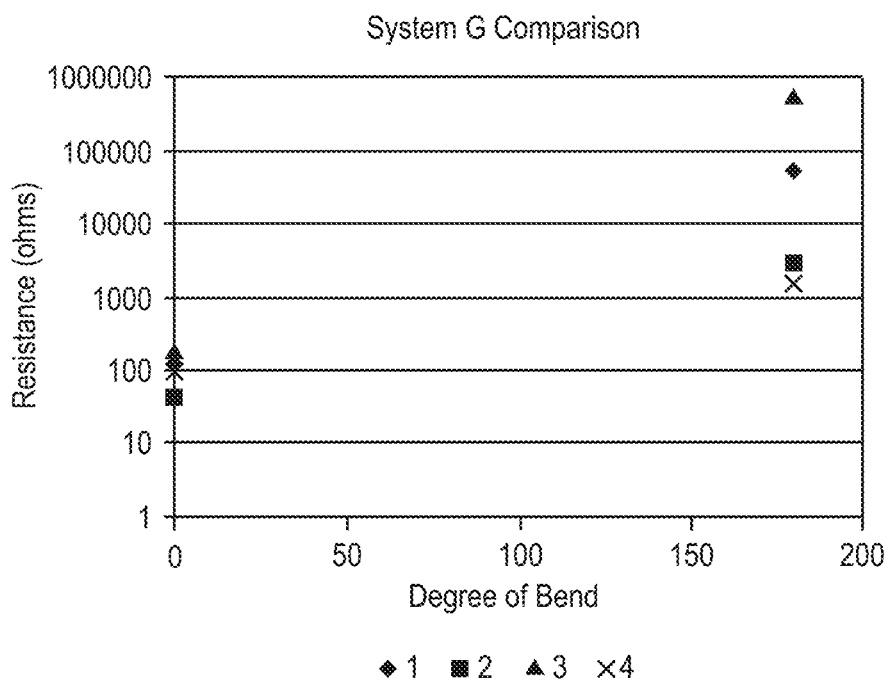
FIG. 13 is a graph depicting the resistance of a series of silver nanowire films containing a hydroxypropyl methylcellulose binder as determined by the angle of bend of the film after thermoforming.
Figure 14:
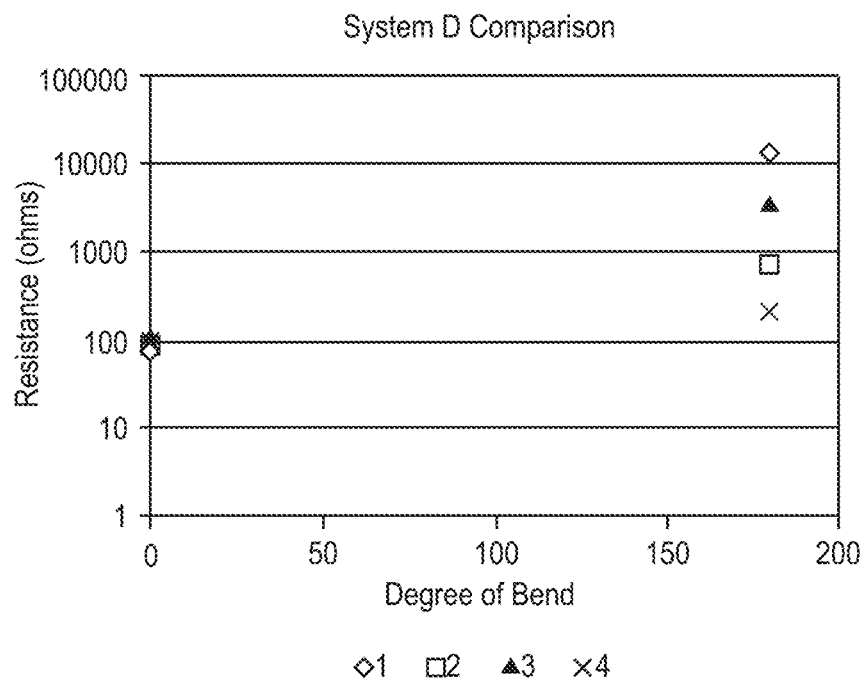
FIG. 14 is a graph depicting the resistance of a series of silver nanowire films containing a polyurethane based binder as determined by the angle of bend of the film after thermoforming.

Another set of samples were formed as described for testing in Example 1. The conductivity for the sample was measured. The heat gun was used to heat the sample above the glass temperature, and the heated sample was then bent 180° with a bending radius of ~0.5 mm. The sample was allowed to cool. The conductivity of the bent sample was measured again. The results are depicted in FIGS. 12-14.

Example 3: Full Thermoform Study

This Example describes the measurements of the stability of the films for molding with a mock formation process.

As in Examples 1 and 2, samples were formed for three ink systems, and for each ink system a plurality of samples were formed. With respect to a first set of samples, for each ink system, four samples were formed with 1) no overcoat, no OCA and no cap polymer, 2) overcoat but no OCA and no cap polymer, 3) no overcoat but OCA and cap polymer, 4) overcoat, OCA and cap polymer. For the first set of samples, the OCA was OCA-4. An other set of samples were prepared with the AgNW solutions (D system) and with different optically clear adhesive tapes from a set of four and with two different cap polymers for a total of 8 additional samples. The samples were formed as rectangular sheet to fit over the mold with uncovered conductive layers along the edges of the sheet.

Figure 15:
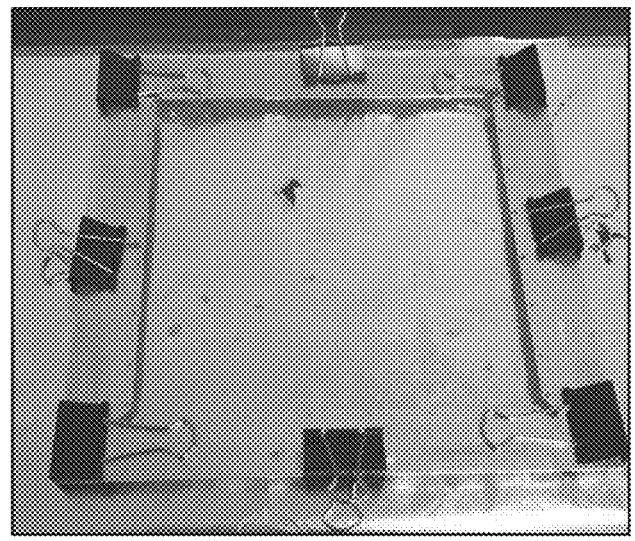
FIG. 15 is a sheet of film clamped prior to molding.
Figure 16:
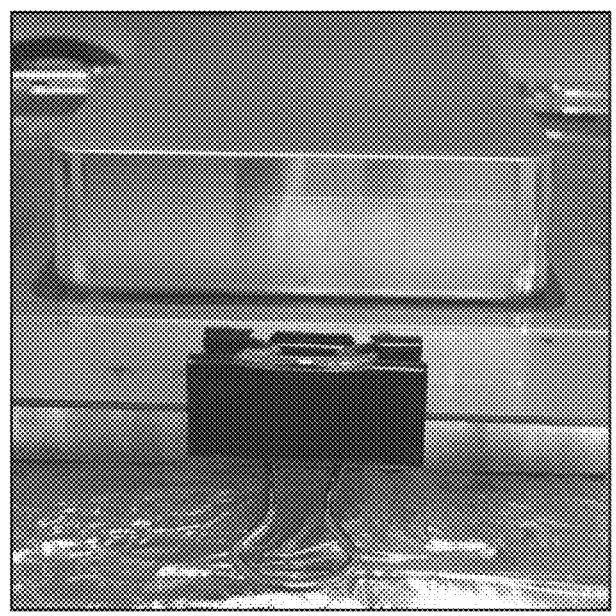
FIG. 16 is a sheet of film placed over a heated mold.
Figure 17:
FIG. 17 is a heat source applying localized heat to a film to assist with thermoform molding.

Conductivity was measured prior to molding. A sample sheet was clamped between two metal braces as depicted in FIG. 15. The mold was heated to 100° C. The clamped full stack was placed between the mold pieces and manually compressed as depicted in FIG. 16. A heat gun at 340° C. was then used to locally heat the stack above the glass temperature and mold the sheet to fit the mold as depicted in FIG. 17. The molded stack was allowed to cool. The conductivity of the molded stack was measured. The results for the 12 samples covering the three ink systems can be found in Table 1, below. The results for the 8 samples covering the different OCA and cap polymers are found in Table 2 below.

TABLE 1

| Log # | Ink System | OC | OCA | Cap Polymer | ohms/sq. (average) | TT % Full Stack (%) | H % Full Stack (%) | Resistance Pre-Form (ohm) | Resistance Post Form (ohm) | Sheet Resistance Pre-Form (ohms/sq.) | Sheet Resistance Post-Form (ohms/sq.) | ΔR/R0 |
|---|---|---|---|---|---|---|---|---|---|---|---|---|
| 1 | Bare | none | none | none | 79.50 | 89.60 | 1.39 | 213.00 | 18000.00 | 79.88 | 6750.00 | 83.51 |
| 2 | Bare | yes | none | none | 47.50 | 90.60 | 1.57 | 76.00 | 3420.00 | 28.50 | 1282.50 | 44.00 |
| 3 | Bare | none | yes | PC | 57.00 | 88.15 | 1.27 | 139.00 | OL | 52.13 | OL | — |
| 4 | Bare | yes | yes | PC | 32.25 | 88.00 | 1.685 | 83.90 | 92.50 | 31.46 | 34.69 | 0.10 |
| 5 | G | none | none | none | 170.50 | 91.15 | 0.53 | 193.00 | OL | 72.38 | OL | — |
| 6 | G | yes | none | none | 183.75 | 91.55 | 0.57 | 278.00 | OL | 104.25 | OL | — |
| 7 | G | none | yes | PC | 162.25 | 89.60 | 0.91 | 236.00 | 481.00 | 88.50 | 180.38 | 1.04 |
| 8 | G | yes | yes | PC | 167.25 | 89.65 | 0.98 | 283.00 | 401.00 | 106.13 | 150.38 | 0.42 |
| 9 | D | none | none | none | 75.75 | 91.45 | 0.85 | 154.00 | 3200000.00 | 57.75 | 1200000.00 | 20778.22 |
| 10 | D | yes | none | none | 72.75 | 90.30 | 0.82 | 252.00 | 2100000.00 | 94.50 | 787500.00 | 8332.33 |
| 11 | D | none | yes | PC | 77.75 | 89.30 | 1.26 | 168.00 | 224.00 | 63.00 | 84.00 | 0.33 |
| 12 | D | yes | yes | PC | 75.25 | 88.65 | 1.23 | 204.00 | 240.00 | 76.50 | 93.38 | 0.22 |

TABLE 2

| Log # | Ink System | OC | OCA Type | Cap Polymer | ohms/sq. (average) | TT % Full Stack (%) | H % Full Stack (%) | Resistance Pre-Form (ohm) | Resistance Post Form (ohm) | Sheet Resistance Pre-Form (ohms/sq.) | Sheet Resistance Post-Form (ohms/sq.) | ΔR/R0 |
|---|---|---|---|---|---|---|---|---|---|---|---|---|
| 1 | D | yes | OCA-1 | PC | 88.00 | 89.95 | 0.89 | 212.50 | 353.00 | 79.69 | 132.38 | 0.66 |
| 2 | D | yes | OCA-1 | PET | 79.50 | 88.65 | 1.72 | 172.00 | 239.00 | 64.50 | 89.63 | 0.39 |
| 3 | D | yes | OCA-2 | PC | 81.50 | 89.75 | 0.96 | 184.00 | 830900.00 | 69.00 | 311587.50 | 4514.76 |
| 4 | D | yes | OCA-2 | PET | 72.50 | 88.75 | 1.66 | 237.00 | 335.00 | 88.88 | 125.63 | 0.41 |
| 5 | D | yes | OCA-3 | PC | 78.50 | 89.75 | 0.94 | 201.00 | OL | 75.38 | OL | — |
| 6 | D | yes | OCA-3 | PET | 79.00 | 88.85 | 1.43 | 190.00 | 254.00 | 71.25 | 95.25 | 0.34 |
| 7 | D | yes | OCA-5 | PET | 77.25 | 88.40 | 1.82 | 237.00 | 273.00 | 88.88 | 102.38 | 0.15 |
| 8 | D | yes | OCA-5 | OC | 76.75 | 89.25 | 0.86 | 204.00 | 237.00 | 76.50 | 88.88 | 0.16 |

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein.

What is claimed is:

1. A formable transparent conductive film comprising a sparse metal conductive layer, a non-elastomeric polymer substrate directly supporting the sparse metal conductive layer, a viscoelastic layer comprising a viscoelastic polymer with a thickness from about 15 microns to about 150 microns over the sparse metal conductive layer on a side of the sparse metal conductive layer opposite the polymer substrate, and a cured polymer overcoat layer between the sparse metal conductive layer and the viscoelastic layer, wherein the film has a total transmittance for visible light of at least about 80%, wherein the cured polymer overcoat layer has a thickness from about 25 nm to about 2 microns, and wherein the formable transparent conductive film has a sheet resistance after bending 180 degrees with a radius of curvature of 0.5 mm of no more than about 1000 ohms/sq.

2. The formable transparent conductive film of claim 1 wherein the sparse metal conductive layer comprises a nanostructured metal network.

3. The formable transparent conductive film of claim 1 wherein the sparse metal conductive layer comprises a polymer binder.

4. The formable transparent conductive film of claim 1 further comprising a cap polymer layer comprising a thermoplastic polymer over the viscoelastic layer.

5. The formable transparent conductive film of claim 1 having a total transmittance of visible light of at least about 88%, a sheet resistance after stretching to 20% strain of no more than about 1000 ohms/sq. and a sheet resistance after bending 180 degrees with a radius of curvature of 0.5 mm of no more than about 800 ohms/sq.

6. The formable transparent conductive film of claim 1 wherein the sparse metal conductive layer is patterned to form regions of low electrical resistance and regions of electrical resistance at least 100 times more resistive than the regions of low electrical resistance.

7. The formable transparent conductive film of claim 1 wherein the film when formed into a frozen configuration bent 90 degrees with a radius of curvature of no more than about 5 centimeters exhibits a surface resistance of no more than about 500 ohms/sq. with a total transmittance with respect to visible light of at least about 80%.

8. A display device comprising a three dimensional surface, light emitting elements positioned to emit light from the surface and the formable transparent conductive film of claim 1 covering at least a portion of the light emitting elements wherein the non-elastomeric polymer substrate that is formed to span an edge of the surface to cover at least portions of two angled surfaces with an angle relating the surfaces of at least about 60 degrees such that the film has a portion with a radius of curvature of no more than about 5 centimeters and wherein the film exhibits a surface resistance of no more than about 500 ohms/sq. with a total transmittance with respect to visible light of at least about 80%.

9. The display device of claim 8 wherein the film exhibits a surface resistance of no more than about 150 ohms/sq. with a total transmittance with respect to visible light of at least about 85%.

10. The display device of claim 8 wherein the film exhibits a surface resistance of no more than about 100 ohms/sq. with a total transmittance with respect to visible light of at least about 87%.

11. A method for forming a device with the display device of claim 8, the method comprising:
    securing the formable transparent conductive film around an edge of the device with the film extending around the edge in contact with at least portions of two surfaces an angle relating the surfaces of at least about 60 degrees to form a film having a surface resistance of no more than about 500 ohms/sq with a total transmittance with respect to visible light of at least about 80%.

12. The formable transparent conductive film of claim 1 having a total transmittance of visible light of at least about 90%.

13. The display device of claim 8 wherein the film exhibits a surface resistance of no more than about 100 ohms/sq. with a total transmittance with respect to visible light of at least about 90%.

14. The display device of claim 8 wherein the sparse metal conductive layer is patterned to form regions of low electrical resistance and regions of electrical resistance at least 100 times more resistive than the regions of low electrical resistance.

15. The method of claim 11 further comprising heating the formable transparent conductive film secured around the edge of the device to form a transparent conductive film, and allowing the transparent conductive film to cool in an angular position.

* * * * *

(12) EX PARTE REEXAMINATION CERTIFICATE (12363rd)
United States Patent
Kambe et al.

(10) Number: US 11,343,911 C1
(45) Certificate Issued: Aug. 16, 2023

(54) FORMABLE TRANSPARENT CONDUCTIVE FILMS WITH METAL NANOWIRES

(71) Applicant: C3Nano Inc., Hayward, CA (US)

(72) Inventors: Yu Kambe, Chicago, IL (US); Yung-Yu Huang, Palo Alto, CA (US); Christopher S. Scully, Campbell, CA (US); Xiqiang Yang, Hayward, CA (US); Ajay Virkar, San Francisco, CA (US)

(73) Assignee: C3 NANO, INC., Hayward, CA (US)

Reexamination Request:
No. 90/019,136, Nov. 30, 2022

Reexamination Certificate for:
Patent No.: 11,343,911
Issued: May 24, 2022
Appl. No.: 14/680,390
Filed: Apr. 7, 2015

Related U.S. Application Data

(60) Provisional application No. 61/978,607, filed on Apr. 11, 2014.

(51) Int. Cl.
*H05K 1/02* (2006.01)
*F21V 21/00* (2006.01)
*H05K 1/03* (2006.01)
*H05K 3/20* (2006.01)
*F21Y 101/00* (2016.01)

(52) U.S. Cl.
CPC .......... *H05K 1/0296* (2013.01); *F21V 21/00* (2013.01); *H05K 1/0274* (2013.01); *H05K 1/032* (2013.01); *H05K 3/20* (2013.01); *F21Y 2101/00* (2013.01); *H05K 2201/0108* (2013.01); *H05K 2201/0129* (2013.01); *H05K 2201/0133* (2013.01); *H05K 2201/0191* (2013.01)

(58) Field of Classification Search
None
See application file for complete search history.

(56) References Cited

To view the complete listing of prior art documents cited during the proceeding for Reexamination Control Number 90/019,136, please refer to the USPTO's Patent Electronic System.

*Primary Examiner* — Sean E Vincent

(57) ABSTRACT

A formable transparent conductive film are described that comprise a sparse metal conductive layer, a thermoplastic polymer substrate supporting the sparse metal conductive layer, a viscoelastic polymer with a thickness from about 15 microns to about 150 microns over the sparse metal conductive layer. A layered film structure can be formed that is suitable for contouring on the surface of a three dimensional object without unacceptable increases in sheet resistance and with good optical transparency and low haze. The formable films can be placed into a frozen configuration bent 90 degrees with a radius of curvature of no more than about 5 centimeters while exhibiting a surface resistance of no more than about 500 ohms/sq. with a total transmittance with respect to visible light of at least about 80%.

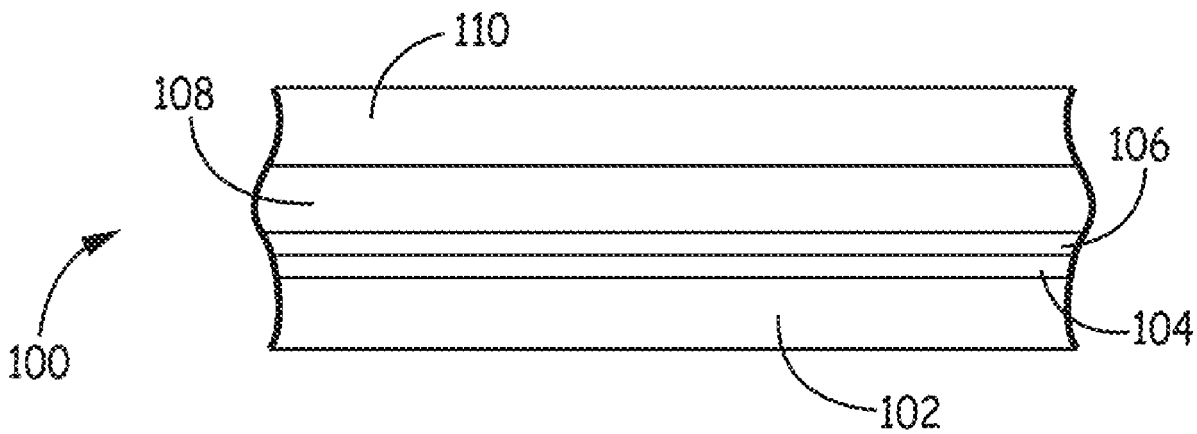

EX PARTE REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 2 is cancelled.

Claims 1, 8-9 and 11 are determined to be patentable as amended.

Claims 3-7, 10 and 12-15, dependent on an amended claim, are determined to be patentable.

New claims 16-20 are added and determined to be patentable.

1. A formable transparent conductive film comprising a sparse metal conductive layer, a non-elastomeric polymer substrate directly supporting the sparse metal conductive layer, a viscoelastic layer comprising a viscoelastic polymer with a thickness from about 15 microns to about 150 microns over the sparse metal conductive layer on a side of the sparse metal conductive layer opposite the polymer substrate, and a cured polymer overcoat layer between the sparse metal conductive layer and the viscoelastic layer, wherein the film has a total transmittance for visible light of at least about 80%, wherein the cured polymer overcoat layer has a thickness from about 25 nm to about 2 microns, and wherein the formable transparent conductive film has a sheet resistance after bending 180 degrees *at a temperature above the glass transition temperature of the non-elastic polymer substrate* with a radius of curvature of 0.5 mm of no more than about 1000 ohms/sq *and wherein the sparse metal conductive layer comprises a fused metal nanostructured network*.

8. A display device comprising a three dimensional surface, light emitting elements positioned to emit light from the surface and the formable transparent conductive film [of claim 1] covering at least a portion of the light emitting elements, wherein the non-elastomeric polymer substrate [that] *is* formed to span an edge of the surface to cover at least portions of two angled *sections of the* surface[s] with an angle [relating the surfaces] of at least about 60 degrees such that the film has a portion with a radius of curvature of no more than about [5] *1* centimeter[s] and wherein the film exhibits a surface resistance of no more than about 500 ohms/sq. with a total transmittance with respect to visible light of at least about 80%, *and wherein the formable transparent conductive film comprises a sparse metal conductive layer, a non-elastomeric polymer substrate directly supporting the sparse metal conductive layer, a viscoelastic layer comprising a viscoelastic polymer with a thickness from about 15 microns to about 150 microns over the sparse metal conductive layer on a side of the sparse metal conductive layer opposite the polymer substrate, and a cured polymer overcoat layer between the sparse metal conductive layer and the viscoelastic layer, wherein the film has a total transmittance for visible light of at least about 80%, wherein the cured polymer overcoat layer has a thickness from about 25 nm to about 2 microns, and wherein the formable transparent conductive film has a sheet resistance after bending 180 degrees at a temperature above the glass transition temperature of the non-elastic polymer substrate with a radius of curvature of 0.5 mm of no more than about 1000 ohms/sq*.

9. The display device of claim 8 wherein the film exhibits a surface resistance of no more than about 150 ohms/sq. with a total transmittance with respect to visible light of at least about 85% *and wherein the angle is 90 degrees*.

11. A method for forming a device with the display device of claim 8, the method comprising:

securing the formable transparent conductive film around [an] *the* edge of the device with the film extending around the edge [in contact with at least portions of two surfaces an angle relating the surfaces of at least about 60 degrees to form a film having a surface resistance of no more than about 500 ohms/sq with a total transmittance with respect to visible light of at least about 80%].

*16. The formable transparent conductive film of claim 1 wherein the overcoat layer has an average thickness from about 25 nm to about 300 nm and the film having haze values from about 0.5% to 2%.*

*17. The formable transparent conductive film of claim 1 further comprising a cap polymer layer comprising a thermoplastic polymer over the viscoelastic layer with an average thickness from about 20 microns to about 500 microns.*

*18. The formable transparent conductive film of claim 8 wherein the sparse metal conductive layer comprises a fused metal nanostructured network.*

*19. The formable transparent conductive film of claim 8 wherein the overcoat layer has an average thickness from about 25 nm to about 300 nm and the film having haze values of 0.5% to 2%.*

*20. The formable transparent conductive film of claim 8 wherein the film exhibits a surface resistance of no more than about 100 ohms/sq. with a total transmittance with respect to visible light of at least about 87% and wherein the film has a total transmittance of visible light of at least about 88%, a sheet resistance after stretching to 20% strain of no more than about 250 ohms/sq. and a sheet resistance after bending 180 degrees with a radius of curvature of 0.5 mm of no more than about 500 ohms/sq.*

\* \* \* \* \*